(12) United States Patent
Zhang

(10) Patent No.: US 9,698,260 B1
(45) Date of Patent: Jul. 4, 2017

(54) HIGH VOLTAGE DEVICE WITH LOW $R_{dson}$

(71) Applicant: GLOBALFOUNDRIES Singapore Pte. Ltd., Singapore (SG)

(72) Inventor: Guowei Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/985,455

(22) Filed: Dec. 31, 2015

(51) Int. Cl.
| | |
|---|---|
| *H01L 29/06* | (2006.01) |
| *H01L 29/78* | (2006.01) |
| *H01L 29/66* | (2006.01) |
| *H01L 29/40* | (2006.01) |
| *H01L 29/08* | (2006.01) |

(52) U.S. Cl.
CPC ........ *H01L 29/7825* (2013.01); *H01L 29/063* (2013.01); *H01L 29/0615* (2013.01); *H01L 29/0865* (2013.01); *H01L 29/0882* (2013.01); *H01L 29/402* (2013.01); *H01L 29/408* (2013.01); *H01L 29/66484* (2013.01); *H01L 29/66704* (2013.01)

(58) Field of Classification Search
CPC ........... H01L 29/0652; H01L 29/66659; H01L 29/7816; H01L 29/7835; H01L 29/0878; H01L 29/1095; H01L 29/42368
See application file for complete search history.

(56) References Cited

U.S. PATENT DOCUMENTS

| | | | | |
|---|---|---|---|---|
| 2007/0063253 A1* | 3/2007 | Choi | ................... | H01L 29/6653 257/315 |
| 2009/0068804 A1* | 3/2009 | Pendharkar | ......... | H01L 29/0878 438/195 |
| 2013/0093012 A1* | 4/2013 | Zhang | ................... | H01L 29/402 257/335 |
| 2014/0091389 A1* | 4/2014 | Hsu | ..................... | H01L 29/7816 257/335 |
| 2014/0264584 A1* | 9/2014 | Zhang | ................. | H01L 29/7835 257/343 |

* cited by examiner

*Primary Examiner* — Whitney T Moore
*Assistant Examiner* — Joseph Galvin, III
(74) *Attorney, Agent, or Firm* — Horizon IP PTE. LTD.

(57) ABSTRACT

High voltage devices and methods for forming a high voltage device are disclosed. The method includes providing a substrate having top and bottom surfaces. The substrate is defined with a device region and a recessed region disposed within the device region. The recessed region includes a recessed surface disposed lower than the top surface of the substrate. A transistor is formed over the substrate. Forming the transistor includes forming a gate at least over the recessed surface and forming a source region adjacent to a first side of the gate below the recessed surface. Forming the transistor also includes forming a drain region displaced away from a second side of the gate. First and second device wells are formed in the substrate within the device region. The first device well encompasses the drain region and the second device well encompasses the source region.

20 Claims, 17 Drawing Sheets

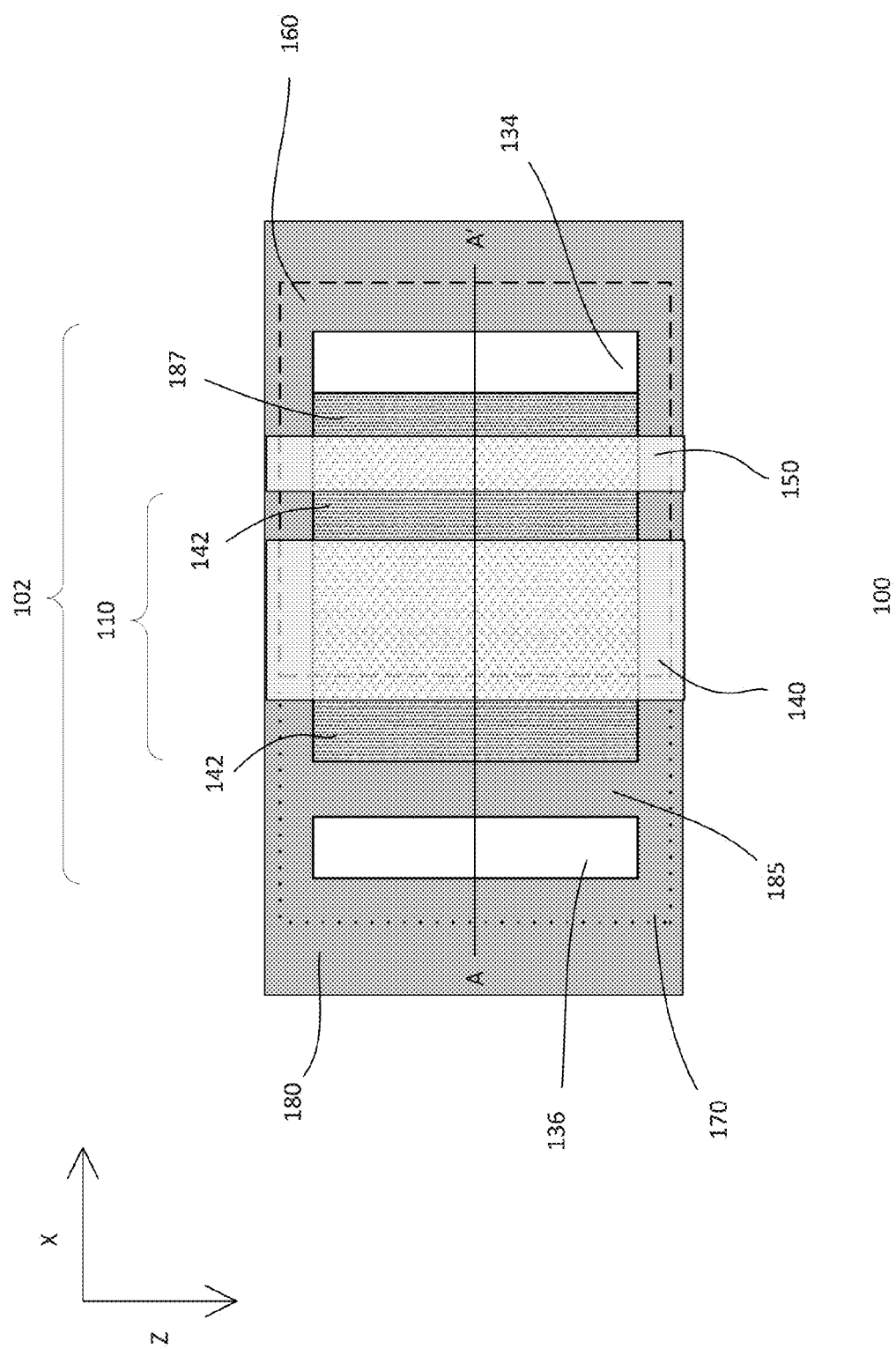

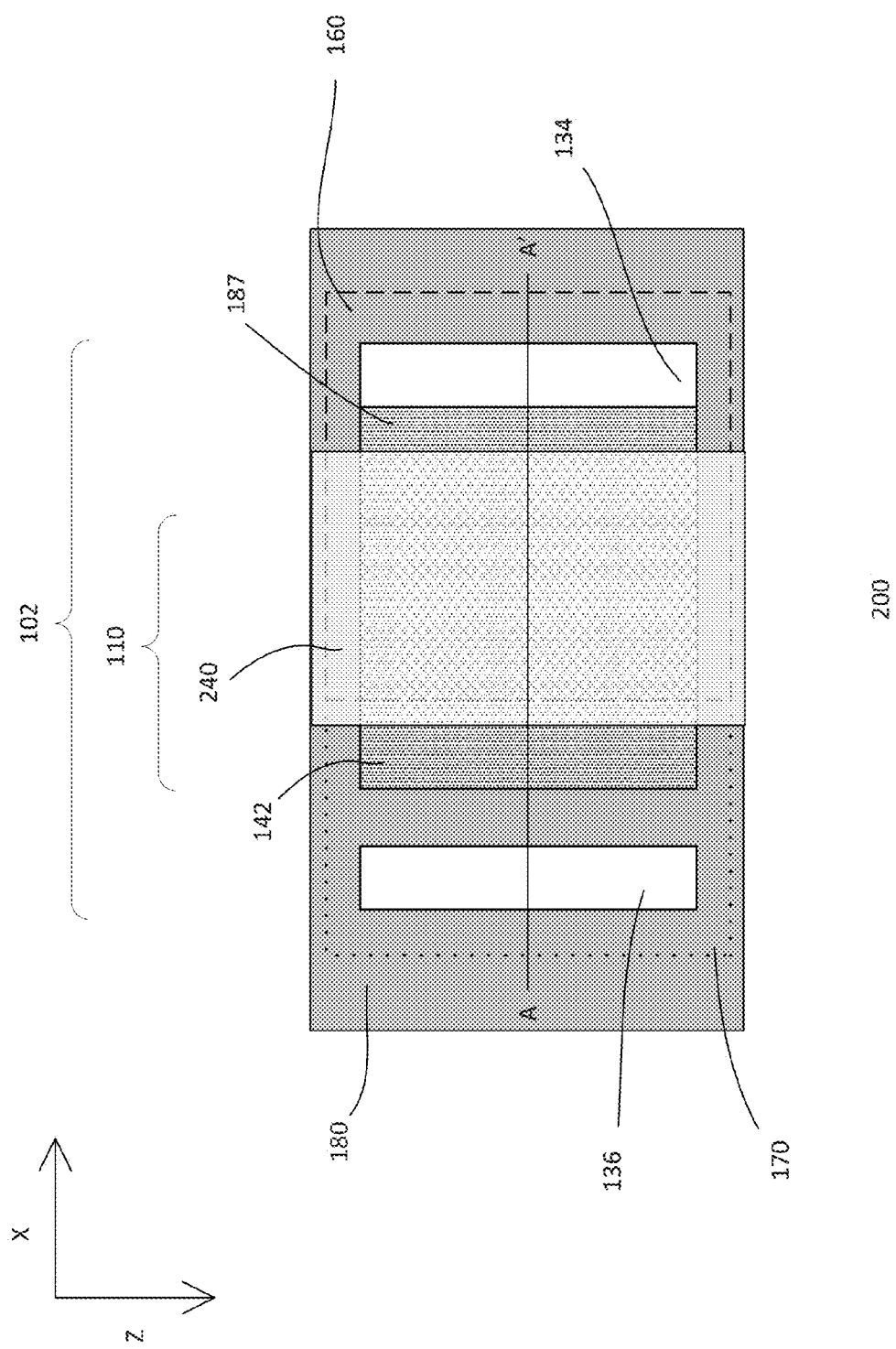

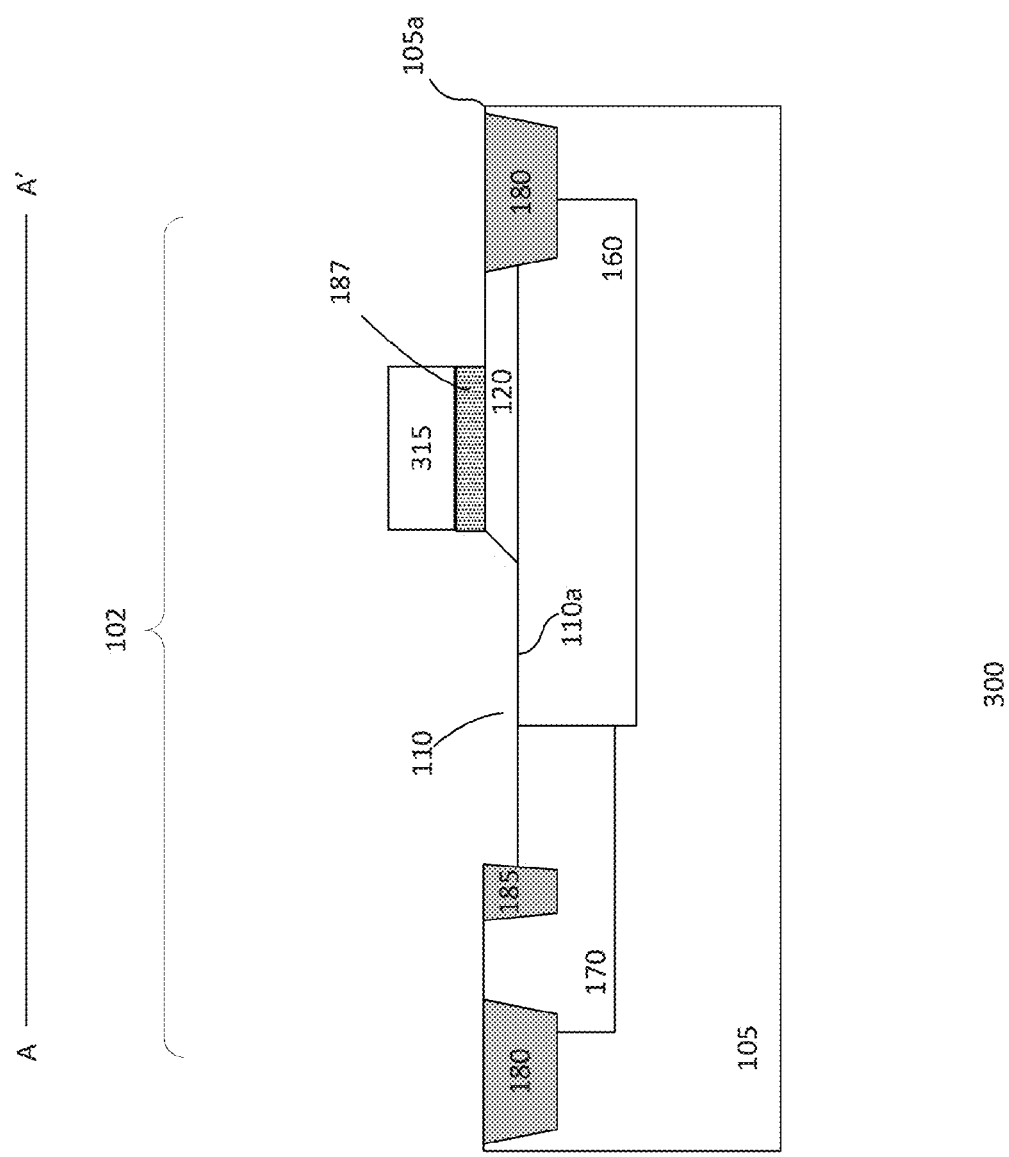

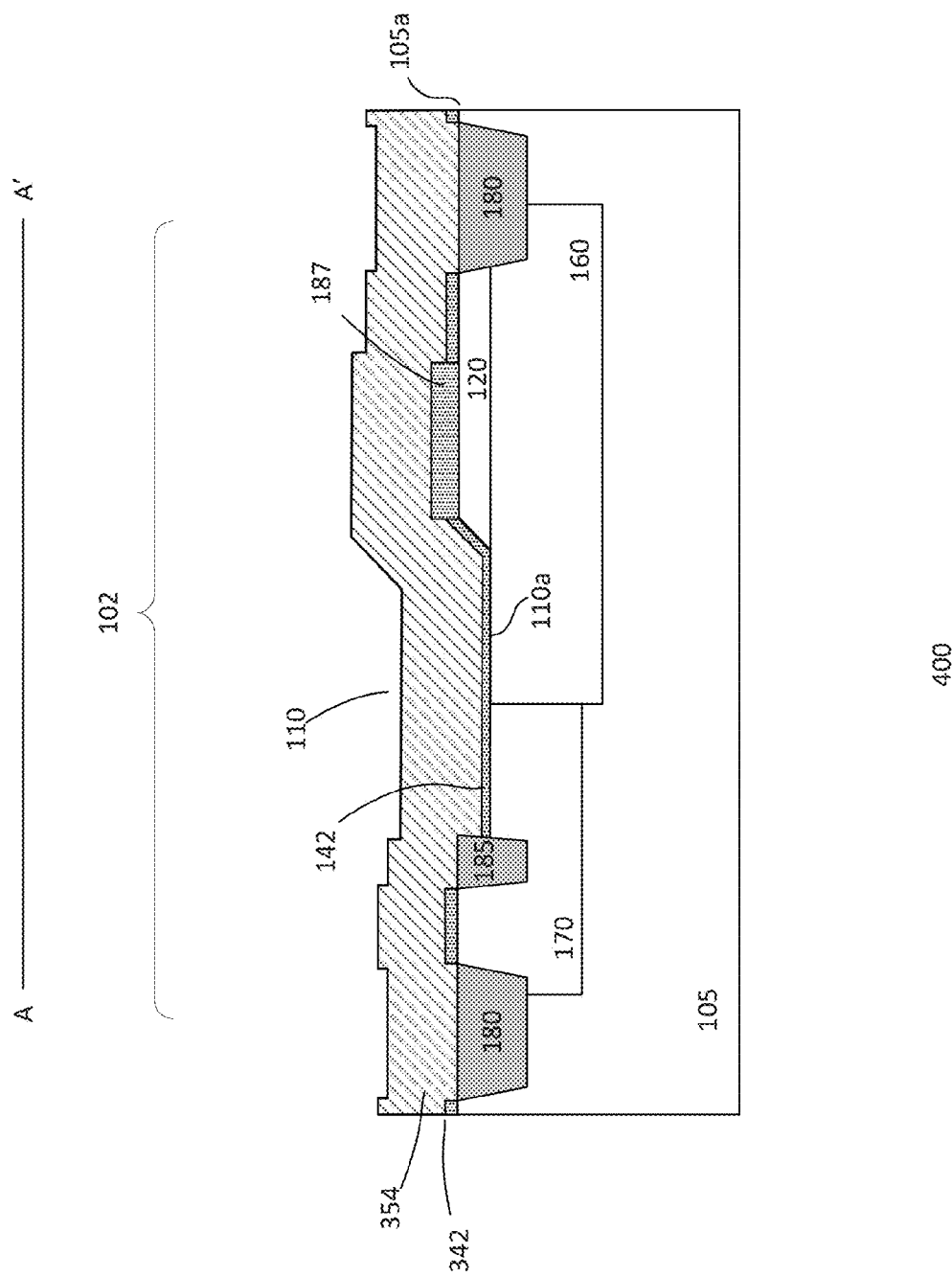

US 9,698,260 B1

HIGH VOLTAGE DEVICE WITH LOW $R_{dson}$

BACKGROUND

Lateral Double-Diffused (LD) transistors have been widely employed in high voltage applications. One factor which affects the performance of the LD transistors is the drain-to-source on-resistance ($R_{dson}$). Higher $R_{dson}$ undesirably results in reduced switching speeds and more energy loss during switching. Various techniques have been employed to design LD transistors with reduced $R_{dson}$. However, conventional LD transistors may be susceptible to the degradation effects associated with hot carrier injection (HCI). For example, impact ionization generated hot carriers may be easily trapped at the silicon and silicon oxide interface regions along the substrate current path. The trapped hot carriers generate defects in the oxide and at the silicon and silicon oxide interface. This compromises device reliability.

From the foregoing, it is desirable to provide reliable low $R_{dson}$ devices with reduced HCl effects.

SUMMARY

Embodiments generally relate to semiconductor devices and methods for forming a semiconductor device. In one embodiment, a method for forming a high voltage device is disclosed. The method includes providing a substrate having top and bottom surfaces. The substrate is defined with a device region and a recessed region disposed within the device region. The recessed region includes a recessed surface disposed lower than the top surface of the substrate. A transistor is formed over the substrate. Forming the transistor includes forming a gate at least over the recessed surface and forming a source region adjacent to a first side of the gate below the recessed surface. The source region extends from the recessed surface into a portion of the substrate. Forming the transistor also includes forming a drain region displaced away from a second side of the gate. The drain region extends from the top surface of the substrate into a portion of the substrate. First and second device wells are formed in the substrate within the device region. The first device well encompasses the drain region and the second device well encompasses the source region.

In another embodiment, a high voltage device is disclosed. The high voltage device includes a substrate having top and bottom surfaces. The substrate is defined with a device region and a recessed region disposed within the device region. The recessed region includes a recessed surface disposed lower than the top surface of the substrate. A transistor is disposed over the substrate. The transistor includes a gate disposed at least over the recessed surface and a source region disposed adjacent to a first side of the gate below the recessed surface. The source region extends from the recessed surface into a portion of the substrate. The transistor also includes a drain region displaced away from a second side of the gate. The drain region extends from the top surface of the substrate into a portion of the substrate. First and second device wells are disposed in the substrate within the device region. The first device well encompasses the drain region and the second device well encompasses the source region.

In yet another embodiment, a method for forming a high voltage device is disclosed. The method includes providing a substrate having top and bottom major surfaces. The substrate is defined with a recessed region. A transistor is formed over the substrate. Forming the transistor includes forming a gate at least over the recessed surface and forming a source region adjacent to a first side of the gate. The source region is disposed directly below a recessed surface of the recessed region. Forming the transistor also includes forming a drain region displaced away from a second side of the gate. First and second device wells are formed in the substrate. The first device well encompasses the drain region and underlaps a portion of the recessed region while the second device well encompasses the source region and underlaps another portion of the recessed region. A field oxide is formed on the top major surface of the substrate and positioned between the gate of the transistor and the drain region. A doped region is formed within the first device well. The doped region underlaps the field oxide.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 1a-1b show various views of an embodiment of a device. For example, FIG. 1a shows a top view of the device and FIG. 1b shows a cross-sectional view of the device;

FIGS. 2a-2b show various views of another embodiment of a device. For example, FIG. 2a shows a top view of the device and FIG. 2b shows a cross-sectional view of the device;

FIGS. 3a-3j show cross-sectional views of an embodiment of a process for forming a device; and FIGS. 4a-4c show cross-sectional views of another embodiment of a process for forming a device.

DETAILED DESCRIPTION

Embodiments generally relate to semiconductor devices or integrated circuits (ICs). More particularly, embodiments relate to high voltage (HV) devices. For example, the HV devices include HV transistors. The HV transistors, for example, include lateral double-diffused metal oxide semiconductor (LDMOS) transistors. The HV devices can be employed as switching voltage regulators for power management applications. The HV transistors can be easily integrated into devices or ICs. The devices or ICs can be incorporated into or used with, for example, consumer electronic products, and particularly portable consumer products such as smart phones, mobile phones, tablets, TV displays and personal digital assistants (PDA).

Figure 1B:
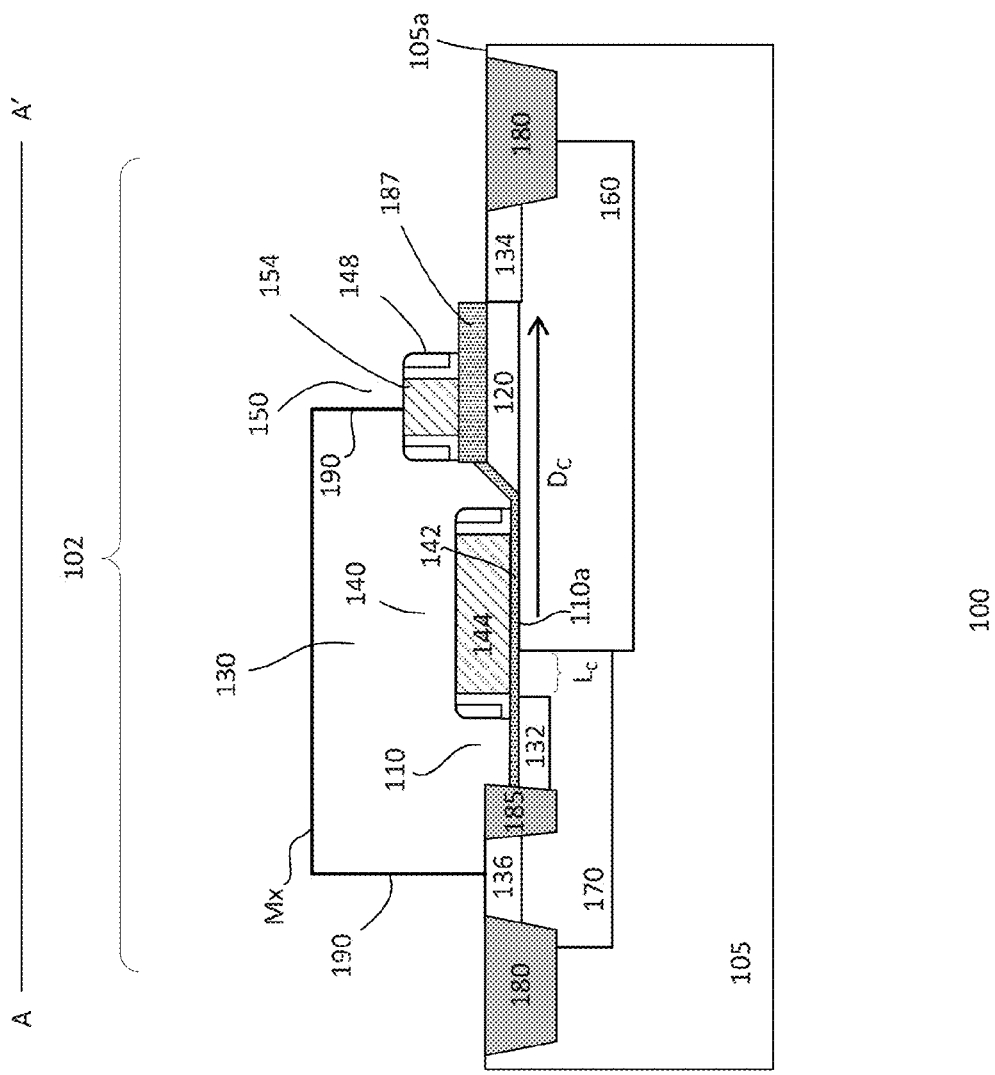

FIGS. 1a-1b show various views of an embodiment of a device 100. The device is, for example, an IC. FIG. 1a shows a top view of the device while FIG. 1b shows a cross-sectional view taken along A-A' of the device.

In one embodiment, the device 100 includes a substrate 105. The substrate, for example, is a silicon substrate. Other types of substrates, such as silicon germanium, germanium, gallium arsenide, or crystal-on-insulator (COI) such as silicon-on-insulator (SOI), are also useful. The substrate may be a doped substrate. In one embodiment, the substrate is lightly doped with second polarity type dopants. For example, the second polarity type may be p-type. Providing a substrate with other types of dopants, or dopant concentrations, as well as an undoped substrate, may also be useful.

The device may include doped regions having different dopant concentrations. For example, the device may include heavily doped ($x^+$), intermediately doped (x) and lightly doped ($x^-$) regions, where x is the polarity type which can be p or n. A lightly doped region may have a dopant concentration of about $1E11$-$1E13/cm^2$, an intermediately doped region may have a dopant concentration of about $1E13$-$1E15/cm^2$, and a heavily doped region may have a dopant concentration of about $1E15$-$1E17/cm^2$. Providing other dopant concentrations for the different types of doped regions may also be useful. For example, the ranges may be varied, depending on the technology node. P-type dopants may include boron (B), aluminum (Al), indium (In), or a combination thereof, while n-type dopants may include phosphorous (P), arsenic (As), antimony (Sb), or a combination thereof.

The substrate includes a device region 102. The device region, for example, is a high voltage (HV) device region for a HV device, such as a HV transistor 130. In one embodiment, the HV transistor includes a LDMOS transistor. Providing other types of devices in the device region may also be useful. The substrate may also include regions for other types of circuitry, depending on the type of device or IC. For example, the device may also include regions for intermediate voltage (IV) and low voltage (LV) devices as well as an array region for memory devices.

Isolation regions may be provided for isolating or separating different device regions of the substrate. The isolation regions, for example, include device isolation region 180 and internal isolation region 185. In one embodiment, the device region 102 is isolated from other regions by a device isolation region 180. For example, the device isolation region 180 surrounds the device region 102. The device region may be an active region of the device 100. As for the internal isolation region 185, it is disposed within the device isolation region 180. The isolation regions are, in one embodiment, shallow trench isolation (STI) regions. A STI region includes an isolation trench filled with isolation or dielectric materials. Other types of isolation regions may also be employed. The STI region, for example, extends to a depth of about 2000-5000 Å from a top surface 105a of the substrate. Providing isolation regions having other depth dimensions may also be useful. For example, the isolation region may be a deep trench isolation (DTI) region. The dimensions, for example, may depend on isolation requirements. The isolation region may include a top surface which is substantially planar with the top surface 105a of the substrate.

In one embodiment, the device region 102 includes a recessed region 110. In one embodiment, a portion of the substrate is recessed to a depth shallower than the top surface 105a of the substrate and top surface of the isolation regions to form the recessed region. This forms a step profile between the top substrate surface 105a and the recessed surface 110a. As shown, the recessed region 110 traverses the device region along a channel width direction (or z direction). In one embodiment, the recessed region extends from an inner edge of the internal isolation region 185 and is sufficiently wide to accommodate at least a source region 132 and a gate 140 of the HV transistor, and partially overlaps first and second device wells 160 and 170 as will be described in detail later. The recessed region 110, as shown, includes a trench having a substantially planar bottom surface or base and tapered sidewalls. In other embodiments, the trench defined by the recessed region may have a substantially planar bottom surface and vertical sidewalls. The recessed region, for example, is disposed at a depth measured from the top substrate surface 105a to the recessed surface 110a. The recessed region, for example, is disposed at a depth of, for example, about 400-4000 Å measured from the top surface 105a of the substrate. Other suitable depths may also be useful. Preferably, the recessed region is disposed at the same depth as or deeper than a depth or bottom of the RESURF region 120 as will be described later.

As described, the device 100 includes a HV transistor 130, such as a LDMOS transistor. The HV transistor includes a gate 140 disposed on the surface of the substrate. In one embodiment, the gate 140 is disposed in the recessed region 110 and traverses the recessed region along the channel width direction. The gate, for example, includes a gate length along a channel length direction. The channel width direction is in the z direction while the channel length direction is in the x direction. The x and z directions, for example, are orthogonal to each other. As illustrated, the gate 140 is a gate conductor of a HV transistor. The gate, for example, may also be a gate conductor which forms gates of multiple transistors (not shown). For example, the gate conductor may traverse a plurality of device regions separated by isolation regions. For example, a plurality of transistors may have a common gate formed by the gate conductor. Other configurations of gate conductors may also be useful.

The gate, for example, includes a gate electrode 144 over a gate dielectric 142. In one embodiment, the gate dielectric lines the exposed substrate surface in the trench of the recessed region 110. The gate dielectric, for example, may be silicon oxide while the gate electrode may be polysilicon. The gate dielectric, for example, may be a HV gate dielectric having a thickness of about 50-500 Å while the gate electrode may be about 500-5000 Å thick. A HV gate dielectric having other suitable thicknesses may also be useful. For example, the HV gate dielectric thickness may depend on a maximum operation voltage. Other suitable configurations of HV gate may also be useful. In some embodiments, the gate electrode may be a doped electrode. For example, the gate electrode may be polysilicon doped with first polarity type dopants. Other suitable types of gate dielectric and gate electrode as well as thicknesses may also be useful.

The transistor 130 also includes first and second doped regions disposed in the substrate adjacent to the first and second sides of the gate 140. For example, the first doped region 132 serves as the source region and the second doped region 134 serves as the drain region. Other configurations of source/drain (S/D) regions may also be useful. The S/D regions of the transistor are heavily doped regions with first polarity type dopants. The polarity type determines the type of the transistor. For example, the first polarity type may be n-type for a n-type transistor or p-type for a p-type transistor. The first and second S/D regions 132 and 134, for example, have a dopant concentration of about $1E15$-$1E17/cm^2$. Other dopant concentrations may also be useful.

In one embodiment, the source region 132 is disposed below the recessed surface 110a adjacent to the first side of the gate 140 and underlaps a portion of the gate. The underlap portion should be sufficient for the source region to be in communication with a channel region located under the gate. As for the drain region 134, it is laterally displaced a distance away from the second side of the gate. As shown, the source region 132 extends from the recessed surface 110a into the substrate while the drain region 134 extends from the top substrate surface 105a into the substrate. The depth of the source region 132 with respect to the recessed surface 110a and the depth of the drain region 134 with respect to the top substrate surface 105a may be about 0.1-0.4 µm. Other suitable depth dimensions may also be useful.

In one embodiment, the portion of the source region which underlaps the gate may be a S/D extension region (not shown). The S/D extension region is, for example, a lightly doped source (LDS) region extending beyond the source region to underlap a portion of the transistor gate 140. The LDS region may include first polarity type dopants for a first type transistor. Other configurations of LDS region may also be useful. In some cases, the S/D extension region may include a halo region extending beyond the LDS region and underlapping the gate. The halo region may be a second polarity type doped region for a first polarity type transistor. Other configurations of S/D extension region may also be useful.

In one embodiment, the device includes a field structure 150. The field structure, for example, may serve as a drain field plate (DFP). The field structure is disposed over the top substrate surface 105a adjacent to the second side of the gate 140. For example, the field structure is disposed in between the second side of the gate of the transistor and the drain region. The field structure includes a field oxide 187 disposed on the top surface of the substrate and a gate electrode 154 disposed on the field oxide. The length of the field oxide of the field structure along the channel length direction is, for example, about 0.1-5 µm and the thickness of the field oxide is about 200-5000 Å. The thickness of the field oxide 187, for example, is greater than the thickness of the HV gate dielectric 142. The thickness of the field oxide may depend on design and process requirements. The field oxide 187 may be disposed along the z direction between the gate 140 and drain region 134. The field oxide, for example, displaces the drain region from the gate. The gate electrode 154, in one embodiment, includes a gate length along the channel length direction and a gate electrode thickness. For example, the gate electrode 154 may have a length of about 0.1-5 µm and a thickness of about 500-5000 Å. Other suitable lengths and thicknesses for the gate electrode of the field structure may also be useful. As shown, the field oxide extends laterally beyond the second side of the gate electrode 154 to about an inner edge of the drain region. The field structure may serve to distribute the electric field across the substrate between the drain region and the gate. This reduces impact ionization at the gate edge, which improves gate dielectric breakdown voltage (Vbr) and allows lower $R_{dson}$ with higher breakdown voltage to be obtained.

In one embodiment, forming the transistor gate 140 may also form the field structure 150. For example, a gate electrode layer may be patterned to form the gate electrodes of the transistor gate and field structure simultaneously. In such cases, the gate electrodes of the transistor gate and field structure 144 and 154 may be formed of the same material and thickness. Alternatively, the gate electrodes of the transistor gate and field structure may be formed in separate process steps to provide a transistor gate having a different material and/or thickness to the field structure. For example, the transistor gate may include a metal gate electrode while the field structure may include a polysilicon gate electrode. Alternatively, the transistor gate may include a polysilicon gate electrode and the field structure may include a metal gate electrode. Other configurations of transistor gate and field structure may also be useful.

Dielectric spacers 148 may be provided on the sidewalls of the transistor gate 140 and field structure 150. The spacers, for example, may be silicon oxide spacers. Other types of dielectric materials may also be useful, such as silicon nitride or a combination of dielectric materials or layers. For example, the spacers may be composite spacers. A composite spacer may include an offset spacer and main spacer. The offset spacer may facilitate forming the S/D extension regions while the main spacers facilitate forming the heavily doped S/D regions. Other configurations of spacers may also be useful. For example, the spacers may be single-layer spacers.

A first device well 160 is disposed in the substrate within the device region. The first device well serves as a drift region or well. For example, the drift well is disposed adjacent to the second side of the transistor gate 140. As shown in FIG. 1b, the drift well encompasses the drain region 134. The drift well connects the drain region to a channel region under the gate. In one embodiment, the drift well underlaps the transistor gate sufficiently to provide the desired $R_{dson}$ resistance and drive current. The length of the overlap between the transistor gate and the drift well, for example, may depend on design requirements.

The first device well (or drift well) 160 includes transistor type dopants. For example, the drift well includes n-type dopants for a n-type transistor or p-type dopants for a p-type transistor. In one embodiment, the dopant concentration of the drift well is less than the source and drain regions, and higher than the substrate. For example, the dopant concentration of the drift well is about $1E12-1E13/cm^2$. Other dopant concentrations may also be useful. The dopant concentration, for example, may depend on the maximum Vbr requirement of the device. In one embodiment, the drift well extends to a depth deeper than the device isolation region 180. The depth of the drift well is, for example, about 0.5-5 µm from the top substrate surface 105a. Other depth dimensions may also be useful. The depth, for example, may depend on the design voltage of the device.

The distance from the drain region to the inner edge of the drift well underlapping the transistor gate may determine a drift distance or drift length of the transistor. The drift length is, for example, about 0.1-10 µm. Other suitable dimensions for the drift length may also be useful. The drift length of the transistor correlates to the $R_{dson}$ of the device. For example, increasing the drift length also increases the $R_{dson}$ of the device. The drift length may be scaled to provide the desired $R_{dson}$. This, for example, provides a sufficiently high resistance drift region to sustain high voltage applied to the drain.

In one embodiment, the device region includes a RESURF region 120 near to the top surface of the substrate. The RESURF region is, for example, a doped region disposed within the first or drift well 160. The RESURF region, in one embodiment, includes second polarity type dopants for a first polarity type drift well. The first polarity type is, for example, n-type and the second polarity is p-type. Other configurations of drift well and RESURF region may also be useful. The dopant concentration for the RESURF region may be greater than the dopant concentration of the drift well. In one embodiment, the RESURF region may be a lightly to intermediately doped p-type region. For example, the dopant concentration of the RESURF region is about $1E12-1E13/cm^2$. Other dopant concentrations may also be useful. The dopant concentrations of the drift well and RESURF region should be selected to achieve the best OFF-state and ON-state performance of the transistor. In addition, the RESURF region and drift well are designed so that they are substantially mutually depleted of free carriers with a relatively low applied drain voltage. This mutual depletion technique is referred to as Reduced Surface Field (RESURF) and it reduces the electric fields in the HV transistor, allowing for high Vbr to be achieved.

In one embodiment, the RESURF region is formed in between the recessed region and the drain region and underlaps the field structure 150. In one embodiment, the RESURF region extends beyond the sides of the field structure and aligns with the drain region and the recessed region. The RESURF region is, for example, contiguous with the field oxide 187. The RESURF region may include a depth shallower than or the same as the recessed region. For example, the depth of the RESURF region is about 400-4000 Å from the top substrate surface 105a. Other depth dimensions of the RESURF region may also be useful.

A second device well 170 is disposed in the substrate within the device region 102. For example, the second device well is disposed adjacent to the first side of the transistor gate 140. In one embodiment, the second device well (or body well) encompasses the internal isolation region 185 and the source region 132, and extends laterally towards the drift well. The body well includes second polarity type dopants for a first polarity type transistor. For example, the body well includes p-type dopants for a n-type transistor or n-type dopants for a p-type transistor. The dopant concentration of the body well may be lower than the dopant concentration of the source and drain regions. In one embodiment, the body well is lightly to intermediately doped with p-type dopants. For example, the dopant concentration of the second device well may be about 1E12-1E14/cm$^2$. Other dopant concentrations may also be useful. The dopant concentration should be sufficient to provide the desired threshold voltage ($V_{TH}$) for the HV transistor while preventing punch-through current.

The body well 170, in one embodiment, includes a depth deeper than the device isolation region 180. The depth of the body well may be about 0.5-10 μm with respect to the top surface 105a of the substrate. Other suitable depth dimensions may also be useful. Although the depth of the body well is illustrated as shallower than the depth of the drift well 160, it is to be understood that the depth of the body well may also be the same as or deeper than the drift well.

In one embodiment, the body well 170 may extend along the channel length direction (or x direction) to about the inner edge of the drift well 160. For example, the inner edge of the body well may be contiguous with the inner edge of the drift well. Other configurations of body well and drift well may also be useful. Although the first and second device wells are shown to be contiguous, it is to be understood that the second device well may also extend to encompass the first device well. For example, the body well may extend beyond the drift well and include a depth deeper than the drift well.

As shown, the body well extends from a bottom of the device isolation region 180 to underlap a portion of the gate 140. In one embodiment, the overlap portion between the gate and the body well determines a length of the channel region of the transistor 130. For example, a length of the channel region is equal to about the distance between the edge of the source region and the inner edge of the body well under the gate. The distance of the overlap portion may be scaled to achieve the desired channel length $L_C$. The channel length, for example, may depend on the technology and design requirements.

A body well tap or contact 136 may be disposed within the body well 170. The body well tap may facilitate contacting and biasing the body well. The body well tap is a second polarity type doped region. For example, the body well tap is doped with the same polarity type dopants as the body well. The body well tap, in one embodiment, is a heavily doped region. The body well tap, for example, has a dopant concentration of about 1E15-1E17/cm$^2$. Other dopant concentrations may also be useful. The body well tap, for example, is disposed within the body well between the internal isolation region and device isolation region. As shown, the internal isolation region 185 isolates the body well tap 136 from the source region 132. This arrangement allows the body well to be biased independently from the source region, such that the body well tap voltage may be different from the source voltage. The body well tap 136, for example, includes a depth from the top substrate surface 105a. The depth of the body well tap 136 may be the same or similar to the depth of the drain region 134. Providing a body well tap having depth dimensions different than that of the drain region may also be useful.

Metal silicide contacts (not shown) may be provided on contact regions of the device. For example, the metal silicide contacts may be disposed on the S/D regions, body well tap, field structure, and transistor gate. The metal silicide contacts, for example, may be nickel or nickle-based metal silicide contacts. Other suitable types of metal silicide contacts, including cobalt or cobalt-based metal silicide contacts may also be useful. The silicide contacts may be about 50-500 Å thick. Other thicknesses may also be useful. Alternatively, metal silicide contacts may also be selectively formed on exposed silicon material during the fabrication process. For example, metal silicide contacts may be formed simultaneously on the exposed S/D regions, body well tap, field structure and transistor gate. Other configurations of metal silicide contacts may also be useful. The metal silicide contacts may be employed to reduce contact resistance and facilitate contact to the back-end-of-line (BEOL) metal interconnects.

A dielectric layer (not shown) is disposed over the substrate. It is understood that there may be additional layers between the dielectric layer and the substrate, such as an etch stop layer. The dielectric layer includes upper and lower portions. The upper portion serves as an intra-metal dielectric (IMD) layer in which conductive lines are formed. The lower portion serves as an interlevel dielectric (ILD) layer in which contact plugs are formed. In one embodiment, the ILD layer is a pre-metal dielectric (PMD) layer. The dielectric layer may be, for example, silicon oxide. Other types of dielectric layers which may serve as the PMD layer may also be used. Contact plugs or via plugs, such as tungsten plugs, may be disposed in the PMD layer. The contact plugs are in communication with the terminals or contact regions of the transistor and field structure.

As shown, the body well tap 136 and the field structure 150 are commonly coupled to a conductive or metal line Mx disposed in the IMD layer through contact plugs 190. For example, the body well tap and field structure are coupled to a metal line having a first potential and the source region 132 is coupled to another metal line having a second potential through via plugs. This allows the body well tap and field structure to be commonly biased at voltage values different from the drain region. The body well tap and field structure are, in one embodiment, biased at a lower voltage than the drain region. The voltage values, for example, may depend on operation requirements. In one embodiment, the field structure which is biased at a lower potential relative to the drain reduces surface electric field and gate-to-drain capacitance (or Miller capacitance), thereby improving the Vbr and switching speed. The field structure, in one embodiment, is biased at a negative voltage in an "off" state and a positive voltage in an "on" state. Such configuration improves both the Vbr and $R_{dson}$ of the HV device.

Additional dielectric layers (not shown) may be formed over the PMD and IMD layers. The additional dielectric layers include interconnects having contacts and conductive or metal lines formed therein. The device may include multiple interconnect levels. The interconnects, for example, provide connections to other contact regions of the device.

Figure 2B:
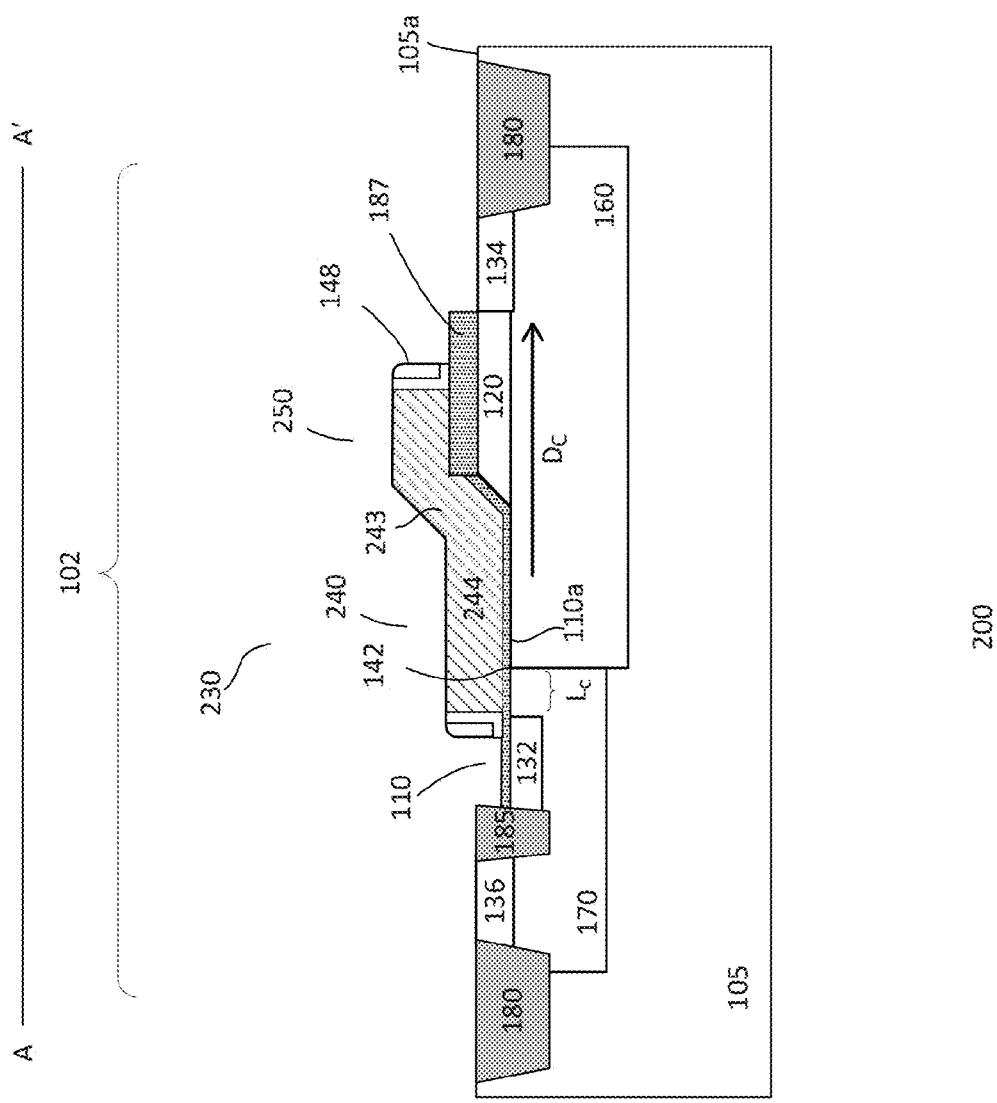

FIGS. 2a-2b show various views of another embodiment of a device 200. The device is, for example, an IC. FIG. 2a shows a top view of the device while FIG. 2b shows a cross-sectional view taken along A-A' of the device. The device 200 is similar to that described in FIGS. 1a-1b. Common elements and features having the same reference numerals may not be described or described in detail. In the interest of brevity, the description of the device 200 below primarily focuses on the difference(s) compared with the device 100 shown in FIGS. 1a-1b.

As shown in FIGS. 2a-2b, the device 200 includes a substrate 105 having a device region 102 surrounded by a device isolation region 180. The device region, for example, is a HV device region for a HV transistor 230, such a LDMOS transistor. The device region includes a recessed region 110.

The device 200 differs from the device 100 shown in FIGS. 1a-1b in that the device 200 includes a transistor 230 having a continuous gate structure disposed over the substrate between the source and drain regions 132 and 134. The continuous gate structure, for example, includes a gate electrode 244 which extends from about the source region to overlap a portion of the field oxide 187. In one embodiment, the continuous gate structure includes first and second linear gate portions 240 and 250 and a non-linear gate electrode portion 243 coupling the first and second linear gate portions. The first linear gate (or first gate) portion is disposed on the HV gate dielectric 142 in the recessed region 110 and the second linear gate (or second gate) portion is disposed on the field oxide 187 over the top substrate surface 105a. The first gate portion 240 serves as the transistor gate and second gate portion 250 serves as a dummy field structure or field plate. In such case, the second gate portion 250 of the continuous gate structure serves to distribute the electric field across the substrate between the drain region and the gate. This reduces impact ionization at the gate edge, which improves gate dielectric Vbr and allows lower $R_{dson}$ to be obtained. In one embodiment, the transistor gate electrode and the gate electrode of the dummy field plate are formed of the same gate electrode layer and thickness. Thus, when the transistor gate is biased at a suitable potential, that potential will be commonly coupled to the dummy field plate.

The embodiments as described in FIGS. 1a-1b and FIGS. 2a-2b result in various advantages. As described, the device 100 or 200 includes a recessed region 110. The recessed region, as described accommodates the source region, gate and channel region of the transistor. For example, as shown, the device includes a channel region and a source region which are recessed below the top surface of the substrate, resulting in the source and channel regions being disposed at a depth deeper or lower than the drain region. This configuration of source, channel and drain regions shifts the substrate current (Dc) away from the silicon and silicon oxide interface and forces the Dc to flow through the bulk of the substrate during operation of the device. Such configuration minimizes or prevents hot carriers from being trapped at the silicon and silicon oxide interface, which results in reduced HCI degradation. Furthermore, substrate surface scattering effect is reduced or lowered since the current is flowing through the bulk of the substrate. This allows higher carrier mobility to be achieved in the drift region, leading to lower $R_{dson}$ which provides for higher switching speed and better performance. Moreover, providing the RESURF region within the drift well advantageously achieves a double RESURF effect which effectively depletes the drift well during operation. This further improves the Vbr of the device.

FIGS. 3a-3j show cross-sectional views of an embodiment of a process 300 for forming a device. The device is, for example, an IC. Other types of devices may also be useful. The device formed by process 300 is similar or the same as the device 100 shown in FIGS. 1a-1b. As such, in the interest of brevity, common elements and features having the same reference numerals may not be described or described in detail.

Figure 3A:
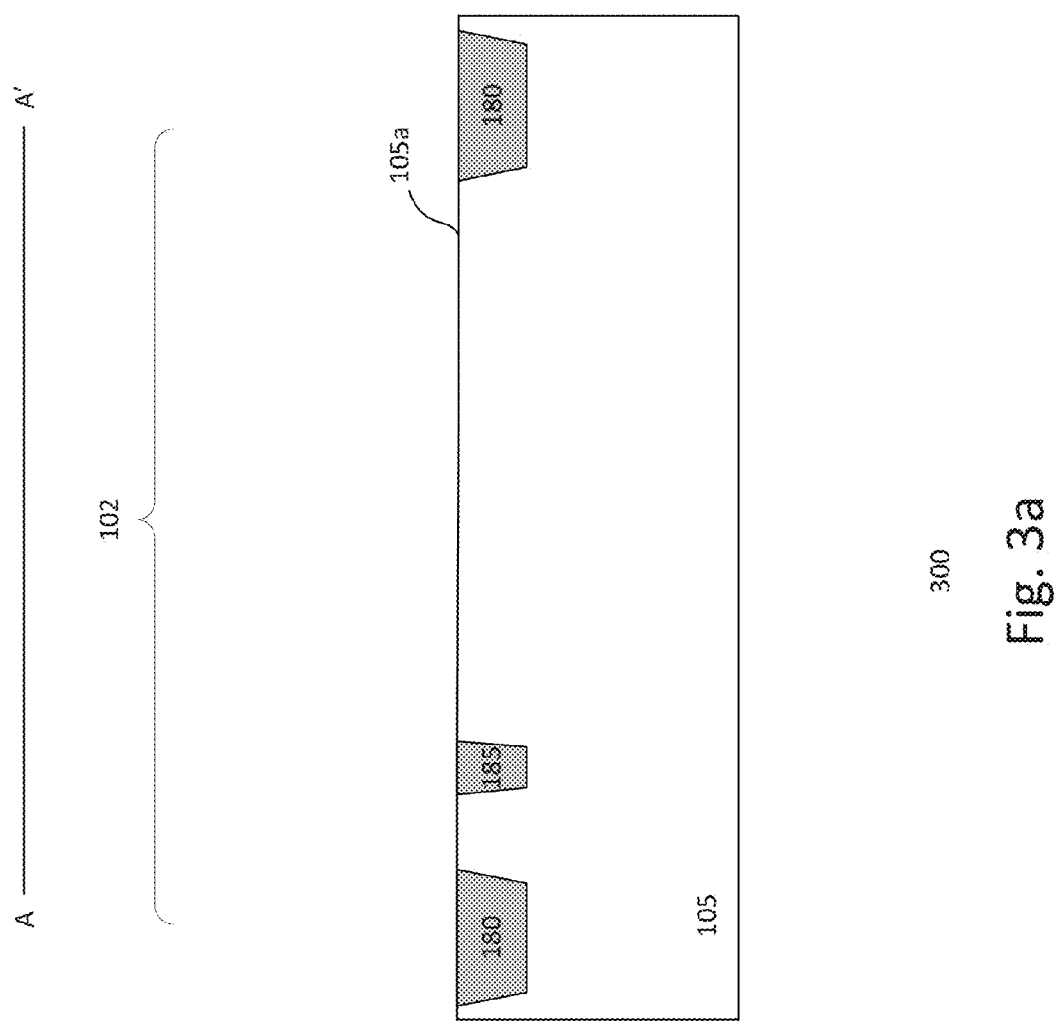

Referring to FIG. 3a, a substrate 105 is provided. The substrate can include a silicon substrate, such as lightly doped p-type or n-type substrate. Other types of substrates, including silicon germanium, germanium, gallium arsenide, or SOI, are also useful. Providing a substrate with other types of dopants or dopant concentrations as well as an undoped substrate, may also be useful.

The substrate 105 is prepared with a device region 102 and various isolation regions. The device region, in one embodiment, serves as a device region for a HV transistor, such as a LDMOS transistor. Although one device region is shown, the substrate may also include other regions (not shown) for other types of circuitry, depending on the type of device or IC. A device isolation region 180 surrounds the device region. The device isolation region, for example, isolates the device region from other regions.

In one embodiment, forming the device isolation region may also form the internal isolation region 185. For example, the different isolation regions may be formed simultaneously having the same depth from the top substrate surface 105a. Alternatively, the different isolation regions may be formed in separate process steps. In such case, the different isolation regions may be formed with different depths from the top substrate surface. The isolation regions are, for example, STI regions. Other suitable types of isolation regions, such as DTI regions, may also be useful.

Various processes can be employed to form the STI regions with configuration as shown and as described in FIGS. 1a-1b above. In one embodiment, the substrate is patterned to form trenches corresponding to locations where the various isolation regions are to be formed. For example, the substrate can be etched using etch and mask techniques to form trenches which are then filled with dielectric materials such as silicon oxide. Chemical mechanical polishing (CMP) can be performed to remove excess oxide and provide a substantially planar top surface. Other processes or materials can also be used to form the STI. The isolation region may also be other types of isolation regions.

Figure 3B:
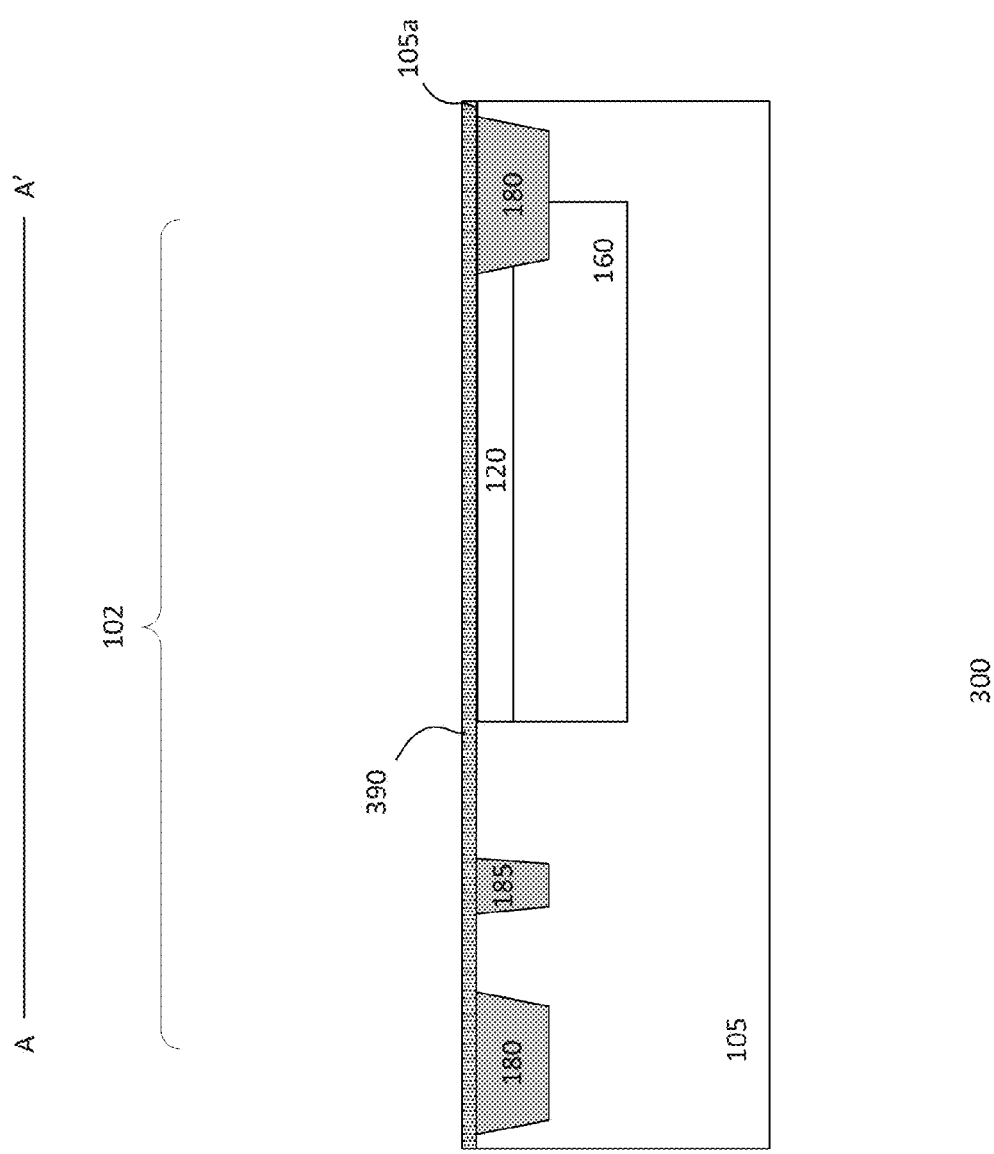

Referring to FIG. 3b, a first oxide or a sacrificial oxide layer 390 is formed over the device region. For example, the first oxide layer includes a thin silicon oxide layer and is deposited on the top surface 105a of the substrate. The first oxide layer, for example, is a pad oxide layer having a thickness of about 100-250 Å. Other suitable thickness may also be useful. A thermal process, such as thermal oxidation process, may be performed to form the first oxide layer. The first oxide layer may also be formed by other suitable processes. The first oxide layer, for example, may serve as a screen oxide layer for subsequent implant steps.

In one embodiment, a first device well (or drift well) 160 is formed in the substrate. The drift well may be implanted with first polarity type dopants for a second polarity type substrate. For example, the first polarity type is n-type and the second polarity type is p-type. Other configurations of drift well and substrate may also be useful. In one embodiment, ion implantation is performed to dope the drift well with first polarity type dopants. To form the drift well, a drift well implant mask (not shown) is formed over the first oxide layer 390. The implant mask, for example, is a photoresist layer patterned by a lithographic mask to expose a portion of the device region. The implant introduces first polarity type dopants into the substrate exposed by the implant mask. The dopants are implanted with the appropriate dose and power to form a drift well having the desired dopant concentration and depth with respect to top surface 105a of the substrate. For example, the dopant concentration of the drift well is about $1E12$-$1E13/cm^2$ and the depth of the drift well is about 0.5-5 µm from the top substrate surface 105a. Other suitable dopant concentration and depth dimensions may also be useful. The implant mask may also expose other device regions to form first polarity type wells (not shown) defined therein.

The process continues to form a second polarity type doped region 120 within the first polarity type drift well 160. The doped region 120 serves as a RESURF region for a first polarity type device. The RESURF region, in one embodiment, is doped with second polarity type dopants, the opposite type as the drift well. For example, the doped region 120 may be doped with second polarity type dopants to form a p-type RESURF region for a n-type drift well. Other configurations of RESURF region may also be useful. For example, the second polarity type may be n-type and the first polarity type may be p-type. The RESURF region may be formed by ion implantation. For example, an ion implantation using an implant mask (not shown) which exposes the drift well is performed to implant second polarity type dopants into the substrate. The implant mask, for example, may be the same as that used to form the drift well. Using separate implant masks for the drift well and RESURF region may also be useful.

The ion implantation may be performed by implanting second polarity type dopants with suitable implant energy and dosage to form the RESURF region 120 with suitable dopant concentration and depth from the top substrate surface 105a. Preferably, the RESURF region includes a higher dopant concentration than the drift well. For example, the RESURF region includes a depth of about 400-4000 Å from the top surface 105a of the substrate and a dopant concentration of about $1E12$-$1E13/cm^2$. Other suitable parameters or techniques to form the RESURF region may also be useful. The implant mask may also expose other device regions to form second polarity type doped regions (not shown) defined therein. After forming the doped region 120, the implant mask is removed.

Figure 3C:
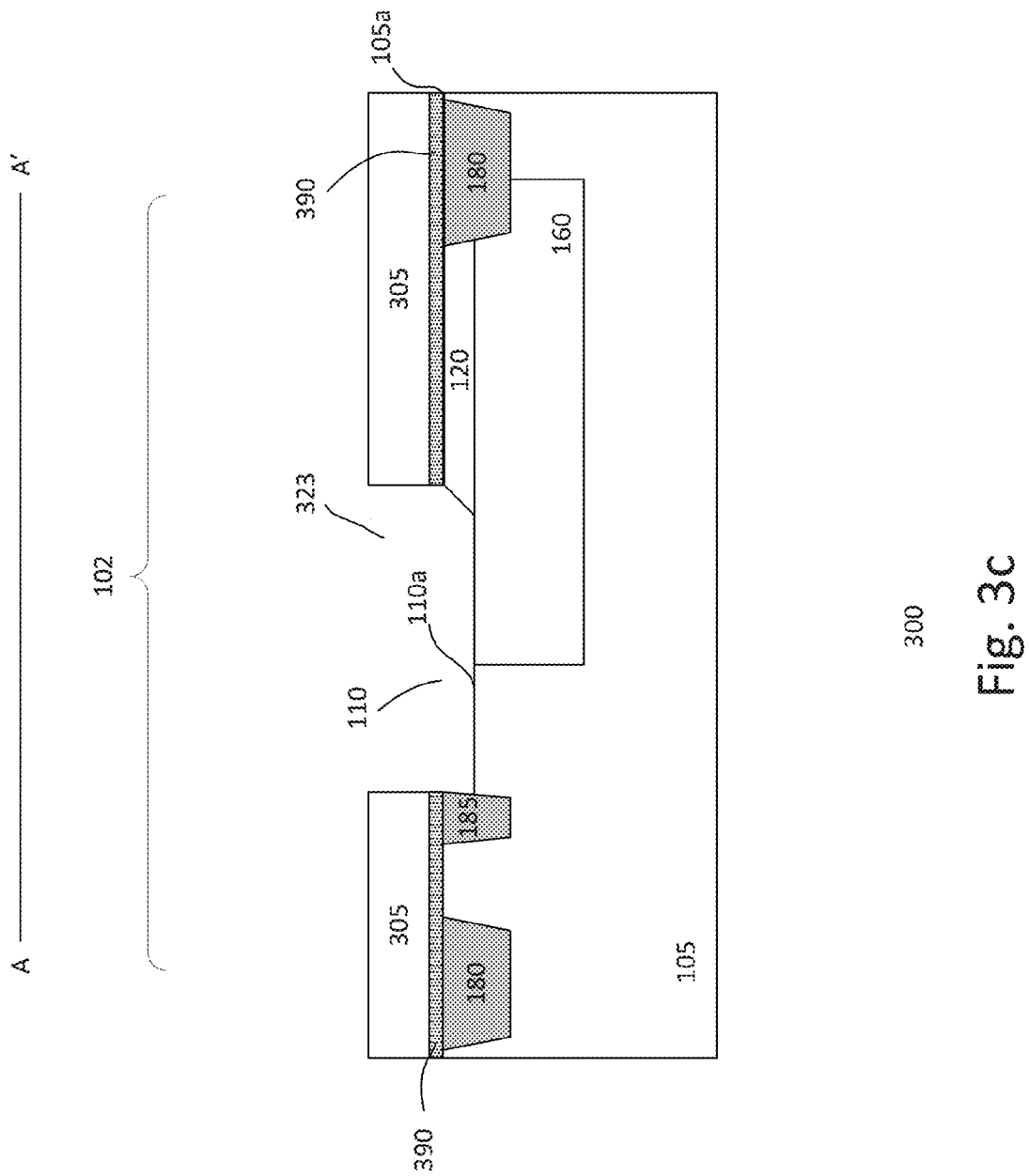

In one embodiment, the process continues to define a recessed region 110 within the device region 102 of the substrate. Referring to FIG. 3c, a mask layer 305 is formed on the substrate. For example, the mask layer is formed over the first oxide layer 390. The mask layer, for example, is a photoresist layer. The mask layer is patterned to form an opening 323, exposing a portion of the substrate where a trench corresponding to the recessed region 110 is to be formed. An etch with suitable etch chemistries using the patterned mask layer is performed to remove exposed portions of the first oxide layer and substrate. This, for example, removes a portion of the substrate and RESURF region 120 not covered by the patterned mask layer 305. The exposed substrate portion, for example, is recessed or etched to a depth of about 400-4000 Å and forms a recessed surface 110a which is lower than the top substrate surface 105a, creating a step profile between the top substrate surface and the recessed surface. In one embodiment, the desired depth for the trench may be set so that the recessed surface 110a is approximately at the same level or depth as the RESURF region 120. Alternatively, the recessed surface may also be slightly lower than the bottom of the RESURF region.

In one embodiment, the recessed region includes a substantially planar bottom surface with tapered sidewalls. For example, a first side of the recessed region is aligned to the internal isolation region 185 and a second side of the recessed region includes a tapered (or slanted) sidewall defined by the etching process as shown in FIG. 3c. In other embodiments, the first side of the recessed region is aligned to the internal isolation region 185 while the second side of the recessed region includes a substantially vertical sidewall. Other suitable sidewall profiles may also be useful, depending on the etch process.

The recessed region may be cleaned after the etch process. For example, the exposed recessed surface or inner surface of the recessed region is cleaned to remove any surface damage from the etch process. For example, the cleaning of the recessed region may be achieved by exposure to hydrogen plasma. Other suitable techniques for cleaning the recessed region may also be useful.

Figure 3D:
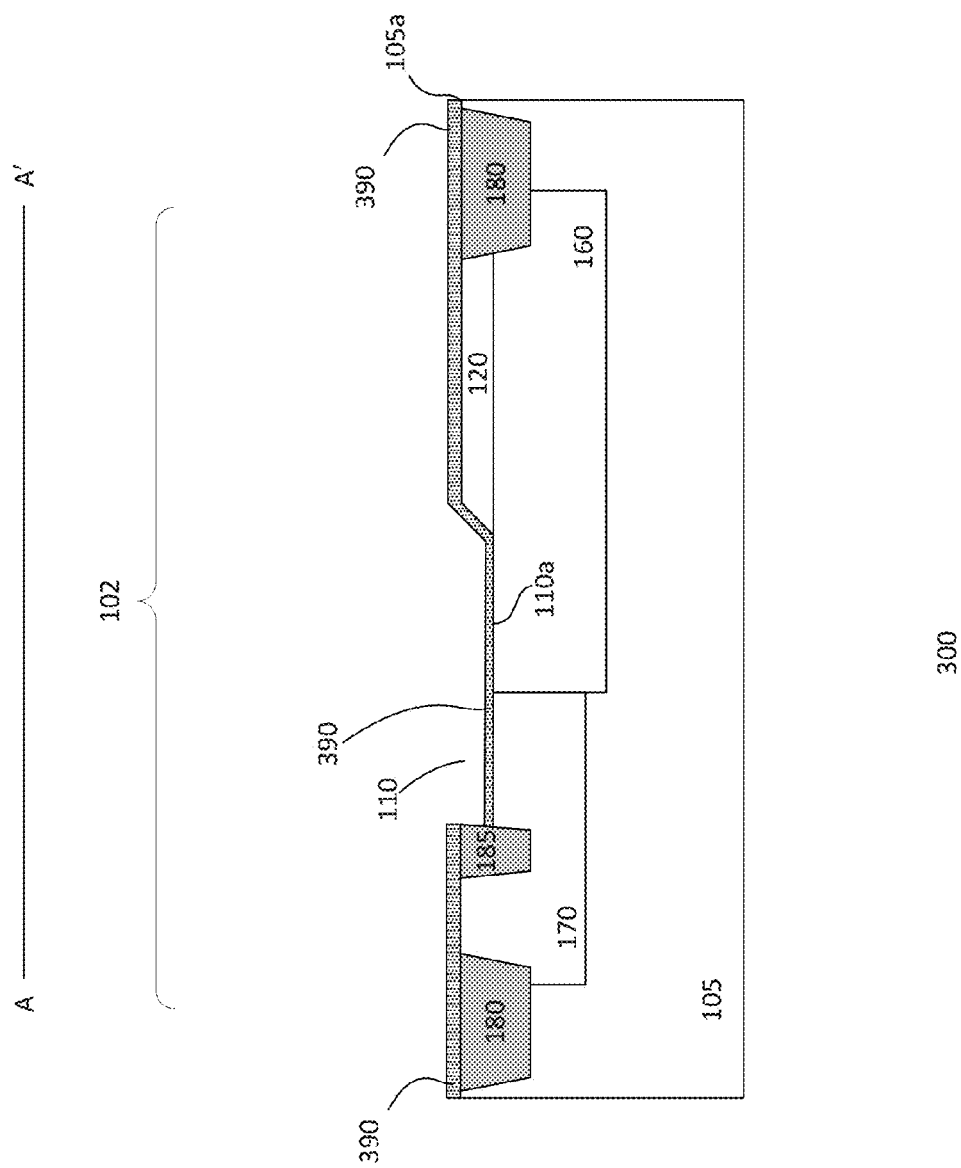

Referring to FIG. 3d, an oxide layer is formed, lining the exposed substrate surface of the recessed region 110. The oxide layer serves as a sacrificial oxide layer. For example, the oxide layer lining the exposed substrate surface of the recessed region includes the same material as the first oxide layer 390 and is formed using technique as described in FIG. 3b. Thus, the oxide layer which lines the recessed surface and the oxide layer which lines the top substrate surface may be collectively referred to as the first oxide layer 390. The oxide layer which lines the top substrate surface and the recessed surface, for example, may also serve as a screen oxide layer for subsequent implant steps.

A second device well (or body well) 170 is formed in the substrate. In one embodiment, the body well is implanted with opposite polarity type dopants than the type of transistor to be formed. For example, the body well is doped with second polarity type dopants for a first polarity type transistor. As an example, the body well is doped with p-type dopants for n-type transistor or n-type dopants for p-type transistor. The body well may be formed by ion implantation. For example, a body well implant mask (not shown) is formed over the first oxide layer 390. To form the body well, the implant mask is patterned to expose a portion of the device region. The implant mask, for example, is a photoresist layer patterned by a lithographic mask. The implant introduces second polarity type dopants into the substrate exposed by the implant mask. The dopants are implanted with the appropriate dose and power to form a body well having the desired depth and dopant concentration. For example, the dopant concentration of the body well is about $1E12$-$1E14/cm^2$ and the depth of the body well is about 0.5-10 µm with reference to the top substrate surface 105a. Other suitable dopant concentration and depth dimensions may also be useful. The implant mask may also expose other device regions to form second polarity type wells (not shown) defined therein. The implant mask is removed after forming the body well.

Figure 3E:
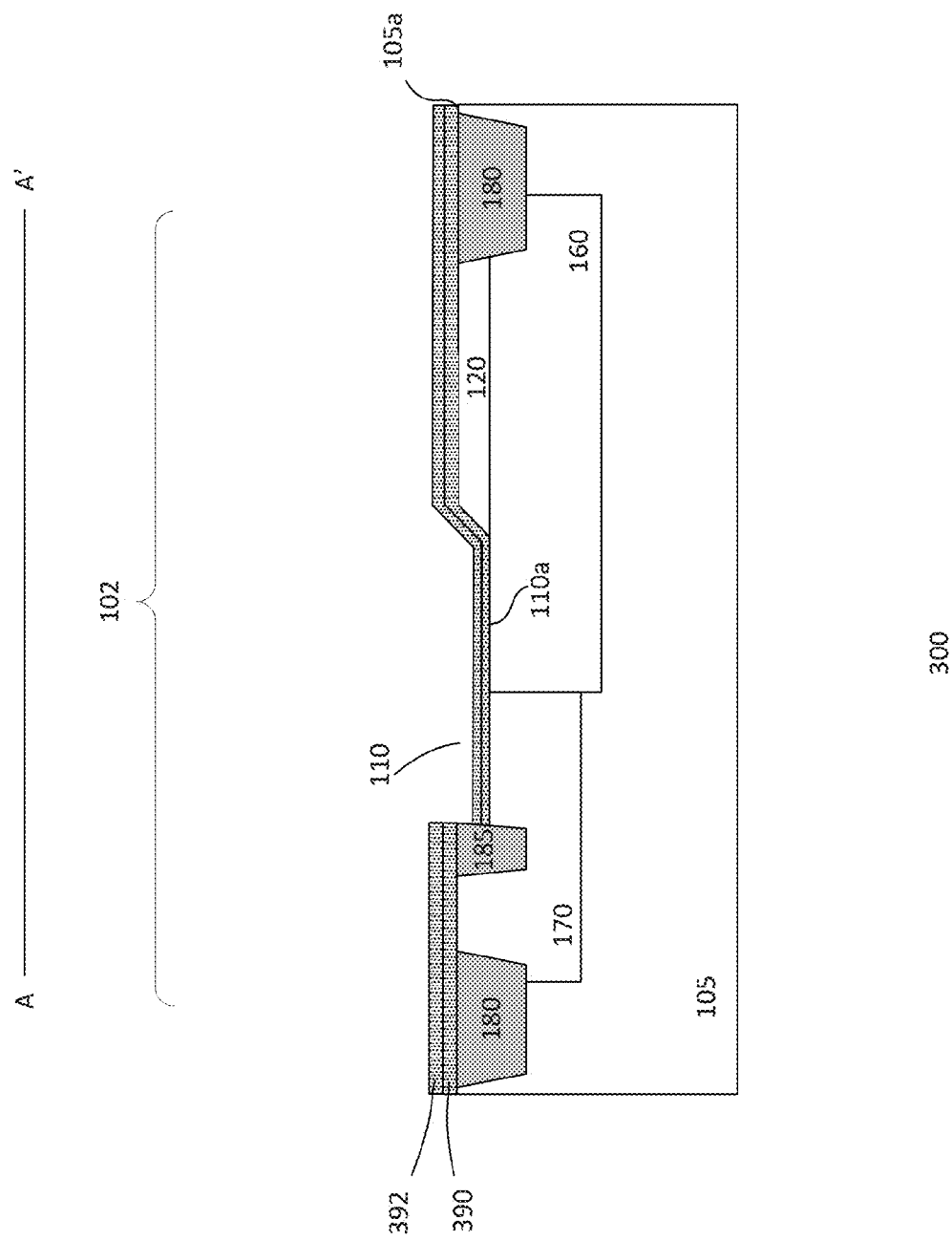

Referring to FIG. 3e, a second oxide layer 392 is conformally formed over the first oxide layer 390 to form an oxide stack. The second oxide layer 392, for example, serves as a top oxide layer of the oxide stack while the first oxide layer 390 serves as a bottom oxide layer of the oxide stack. The first and second oxide layers may be of the same material, such as silicon oxide. The second oxide layer 392, for example, may be formed over the first oxide layer by chemical vapor deposition (CVD). Other suitable techniques may also be used to form the oxide layer. In one embodiment, the second oxide layer includes a thickness where in combination with the thickness of the first oxide layer 390 provides a desired thickness of a field oxide formed over the substrate. For example, the thickness of the oxide stack corresponds to the desired thickness of the field oxide which will be defined later.

Referring to FIG. 3f, a field oxide mask layer 315 is formed over the oxide stack. The mask layer is, for example, a photoresist layer. The mask layer is patterned to protect the portion of the oxide stack corresponding to the field oxide. For example, exposed portions of the oxide stack not protected by the patterned mask 315 are removed, while the portion of oxide stack under the patterned mask remains to form the field oxide 187. In one embodiment, the thickness of the oxide stack corresponds to the thickness of the field oxide. The thickness of the field oxide may, for example, be about 200-5000 Å. Other suitable thicknesses may also be useful. The process to remove the oxide stack, for example, may include an etching process such as a wet etch or dry etch. Other suitable techniques may also be employed to pattern the oxide stack. A surface clean may be performed to prepare the substrate for forming a gate dielectric layer.

Figure 3G:
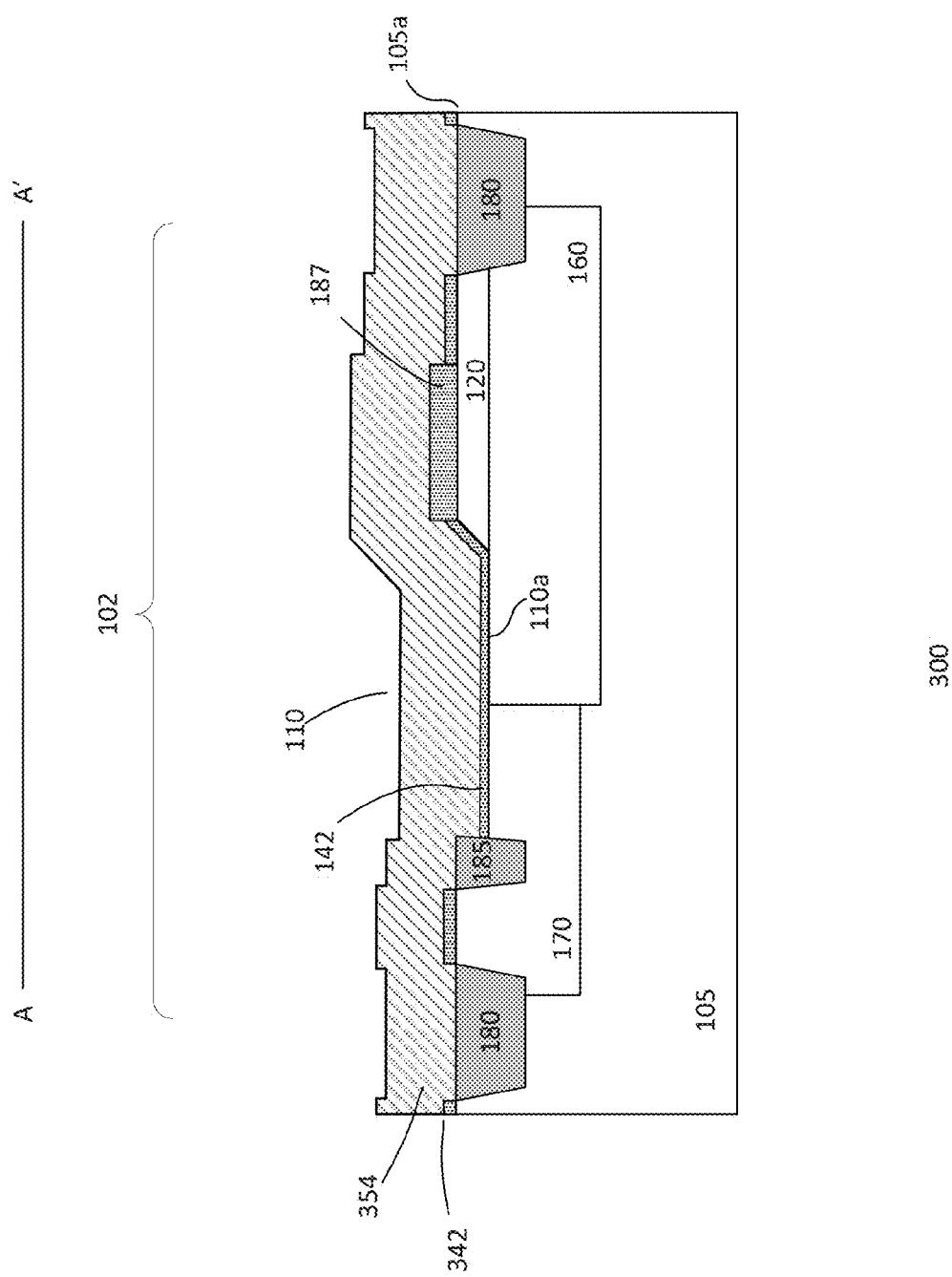

In one embodiment, a gate dielectric layer 342 is formed on the substrate. For example, the gate dielectric layer is formed on exposed substrate material, such as silicon, as shown in FIG. 3g. The gate dielectric layer includes suitable dielectric materials, such as silicon oxide. The gate dielectric layer, for example, may be formed by thermal oxidation. Other suitable techniques, such as CVD may also be useful. In one embodiment, the gate dielectric layer forms the HV gate dielectric layer of a HV transistor. For example, the portion of gate dielectric layer within the recessed region corresponds to the HV gate dielectric 142. The thickness of the HV gate dielectric may be about 50-500 Å. Other suitable thickness may also be useful. After forming the gate dielectric layer, the substrate may be annealed in a nitrogen ambient to improve the quality of the gate dielectric.

Referring to FIG. 3g, a gate electrode layer 354 is conformally formed over the substrate and covers the gate dielectric layer 342. The gate electrode layer, for example, may be a silicon layer. The silicon layer, for example, may be a polysilicon layer. The thickness of the gate electrode layer may be about 500-5000 Å. Other suitable thickness dimensions may also be useful. The gate electrode layer may be formed by, for example, CVD. Other suitable techniques for forming the gate electrode layer may also be useful. In other embodiments, the gate electrode layer may be formed as an amorphous or non-amorphous layer. In the case of an amorphous layer, an anneal may be performed to form a polycrystalline silicon layer. Other configurations of gate electrode layer may also be useful.

Figure 3H:
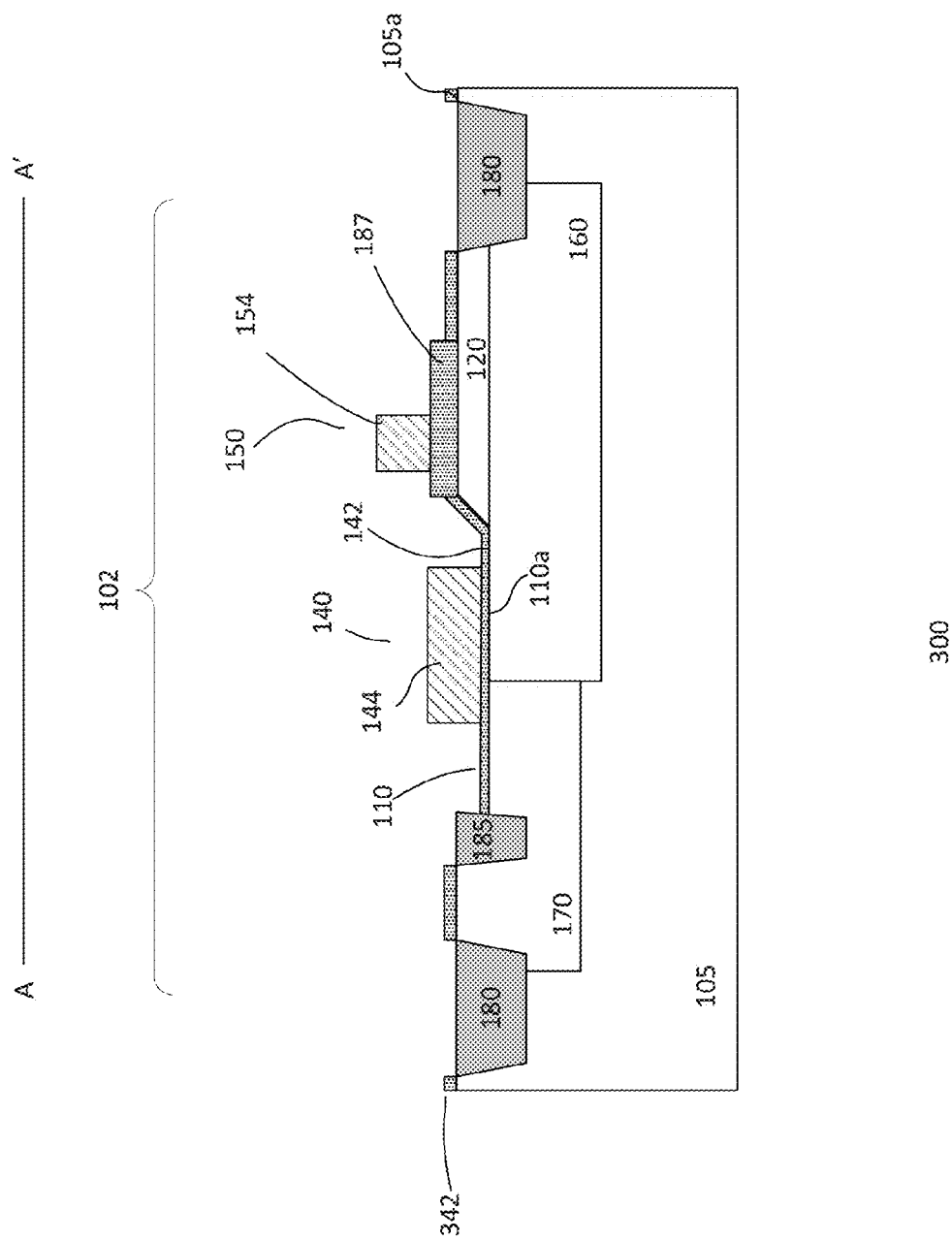

In FIG. 3h, the gate electrode layer is patterned to form first and second gate electrode structures 144 and 154. Patterning the gate electrode layer may be achieved by mask and etch techniques. For example, a patterned gate mask (not shown) may be provided over the substrate to protect portions of the gate electrode layer corresponding to the transistor gate 140 and field structure 150. Exposed portions of the gate electrode layer are removed using an anisotropic etch, such as a RIE. The gate electrode layer may also be patterned to form gates of other transistors in other device regions. Other techniques for patterning the layer may also be useful. After patterning the gate layer, the gate mask is removed by, for example, ashing.

Figure 3I:
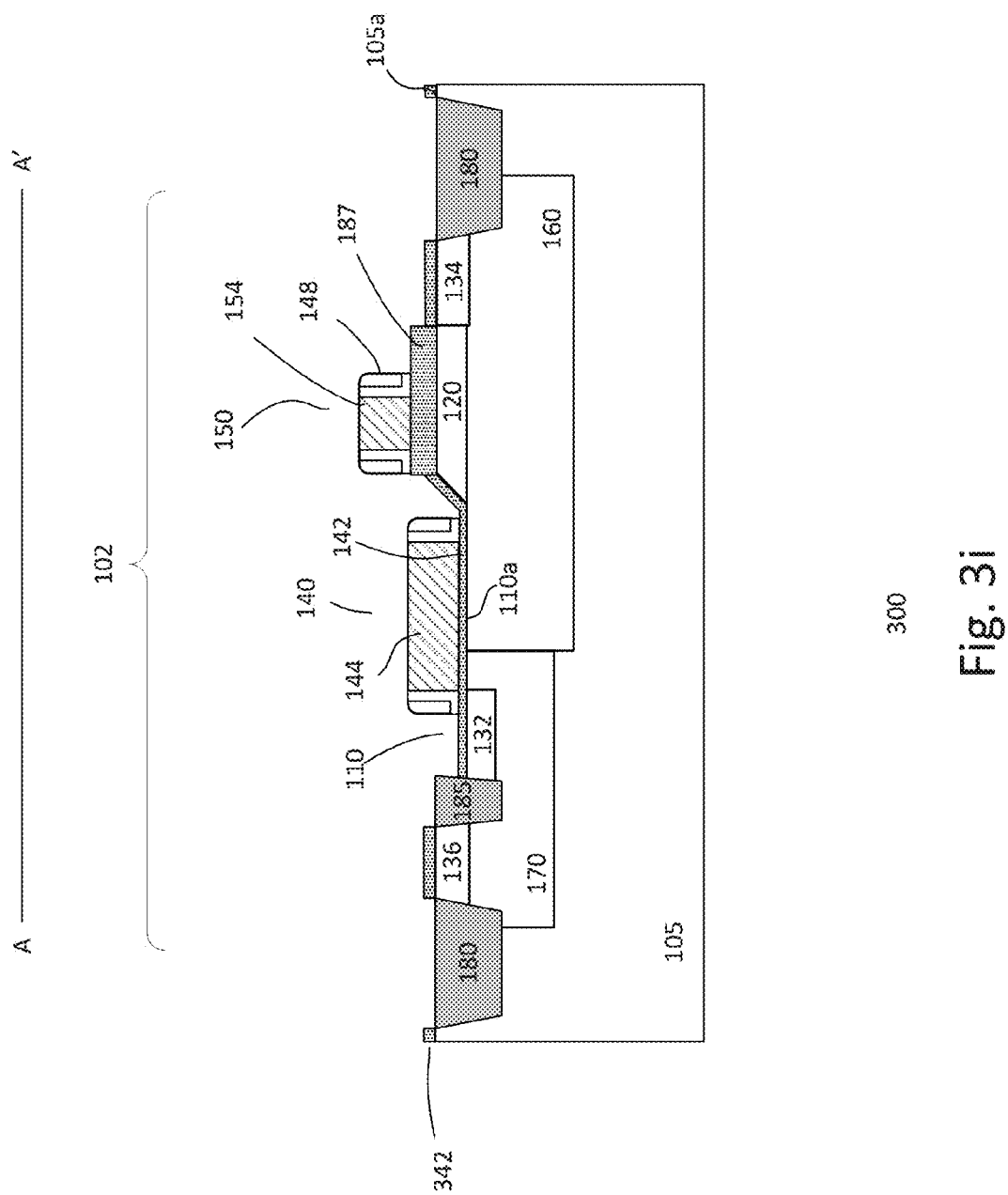

Referring to FIG. 3i, sidewall spacers 148 may be formed on the sidewalls of the gate 140 and field structure 150. To form the sidewall spacers, a dielectric layer is deposited on the substrate. The dielectric layer, for example, may be silicon oxide. Other types of dielectric material, such as silicon nitride, or a combination of several layers of different materials, may also be used. The dielectric layer may be formed by CVD. The dielectric layer may also be formed using other techniques. The thickness of the dielectric layer may be, for example, about 50-250 nm. Other thickness for the dielectric layer may also be useful. The thickness, for example, may depend on the desired width of the spacers. An anisotropic etch, such as RIE, may be performed to remove horizontal portions of the dielectric layer, leaving spacers on the sidewalls of the gate. In some applications, the spacer may be formed from multiple dielectric layers.

After forming the spacers, heavily doped source and drain regions 132 and 134 are formed in the substrate. The source and drain regions include first polarity type dopants for a first polarity type transistor. In one embodiment, the source and drain regions are formed by ion implantation. The implant may employ a source/drain (S/D) implant mask (not shown) having openings which expose portions of the substrate where the source and drain regions are to be formed. For example, the source region 132 is formed adjacent to the first side of the gate 140 while the drain region 134 is formed at a distance away from the second side of the gate. The drain region, for example, is formed in the exposed substrate portion in between the field oxide 187 and device isolation region 180. The implant mask may be a photoresist mask. The implant mask also protects a body well contact region 136 of the substrate. The S/D implant mask may also expose source and drain regions of other first polarity type transistors to form source and drain as well as first polarity type well contact regions to form first polarity type body well taps. The S/D regions are implanted to a depth below the substrate surface. For example, the source region is implanted to a depth below the recessed surface 110a of the recessed region 110 while the drain region is implanted to a depth below the top surface 105a of the substrate. The depth, for example, may be about 0.1-0.4 µm. Providing S/D regions having other depths may also be useful. Suitable implant parameters may be used to form the S/D regions, depending on implant species and junction requirements. An anneal is performed to diffuse and activate the dopants.

It is to be understood that S/D extension regions (not shown) may be selectively formed before forming the transistor S/D regions 132 and 134. For example, the source region 132 may include a LDS region extending beyond the source region to underlap a portion of the gate 140. Forming the LDS region includes implanting first polarity type dopants into the substrate for a first polarity type transistor. The process may also form S/D extension regions of first type transistors in other device regions.

In some embodiments, the gate regions may be doped at the same time as the source and drain regions. For example, the first polarity type S/D implant may be used to dope the gates of NMOS transistors. After the source and drain are formed, the S/D implant mask is removed.

A body well tap or contact 136 is formed in the device region, as shown. The body well tap 136 is formed within the body well 170 and isolated from the source region by the internal isolation region 185. The body well tap is a heavily doped region having second polarity type dopants. The body well tap, for example, may be formed when forming second polarity type source and drain regions for second polarity type transistors in other device regions (not shown). An implant mask (not shown), such as photoresist, may be used to perform the implant to form the body well tap. The implant mask may also expose S/D regions of second polarity type transistors to form second polarity type source and drain regions (not shown). After the implant, the implant mask is removed.

Figure 3J:
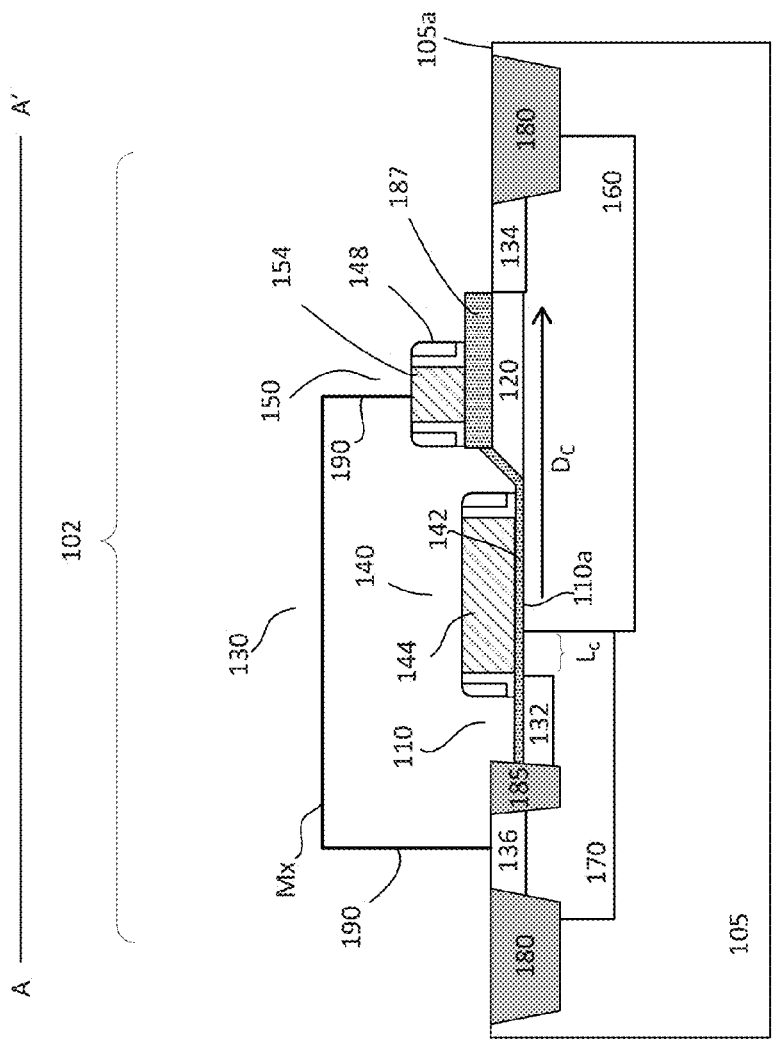

Referring to FIG. 3*j*, the process continues to form the device as shown in FIGS. 1*a*-1*b*. For example, the process may continue to form metal silicide contacts (not shown) and contacts or via plugs 190. Prior to forming the metal silicide contacts, the exposed portions of gate dielectric layer 342 on the top substrate surface 105*a* are removed by mask and etch techniques. For example, the gate dielectric layer over the source and drain regions 132 and 134 as well as over the body well tap 136 are removed prior to the formation of metal silicide contacts. Silicide contacts are formed on terminals or contact regions of the transistor. For example, the silicide contacts are formed on the gate, field structure, S/D regions and body well tap of the transistor. The metal silicide contacts, for example, may be cobalt silicide (CoSi). Other types of metal silicide contacts may also be useful. For example, the metal silicide contacts may include titanium, nickel, or other suitable silicide materials. The silicide contacts can be formed by physical vapor deposition (PVD). Other types of contacts that can be formed by other types of processes can also be used. The silicide contacts are self-aligned to the contact regions. This ensures that the complete surfaces of the S/D regions, body well tap, gate and field structure are silicided. Front-end-of-line (FEOL) processing, for example, may be completed after silicide formation. The metal silicide contacts may be employed to reduce contact resistance and facilitate contact to the back-end-of-line (BEOL) metal interconnects.

A dielectric layer (not shown) is formed on the substrate covering the transistor and the field structure. The dielectric layer serves as an interconnect dielectric layer in which interconnects are formed to couple to the various contact regions or terminals of the transistor and field structure. The dielectric layer, for example, is a silicon oxide layer. Other types of dielectric materials are also useful. The dielectric layer includes upper and lower portions. The upper portion serves as an intra-metal dielectric (IMD) layer in which conductive lines are formed. The lower portion serves as an interlevel dielectric (ILD) layer in which contact plugs are formed. In one embodiment, the ILD layer is a pre-metal dielectric (PMD) layer in which contact plugs are formed to contact regions on the substrate, such as the contact regions of the transistor, including the source, drain, gate and field structure.

The upper and lower portions of the dielectric layer are separate portions. The conductive lines and contact plugs formed in the upper and lower portions are formed using separate processes, such as single damascene processes. For example, via openings are formed in the PMD layer using, for example, mask and etch processes such as RIE. The via opening are filled with a conductive material and excess conductive material is removed by, for example, CMP to form a planar top surface with exposed contact plugs in the via openings. Thereafter, IMD layer is formed over the PMD layer. Trenches are formed in the IMD layer using mask and etch processes. The trenches correspond to conductive or metal lines and are in communication with contact plugs in the PMD layer. The trenches are filled with conductive material and excess conductive material is removed by, for example, CMP, to provide a planar top surface with exposed conductive lines. Other suitable techniques may also be employed to form the contact plugs and conductive lines. For example, RIE technique may be used or a combination of RIE and damascene technique may also be useful. For the case where the contact plugs and conductive lines are formed using separate processes, the conductive material of the plugs and lines may be different. For example, the contact plugs are tungsten (W) plugs while the conductive lines are copper lines. Other suitable types of conductive material may also be useful.

Contact plugs are formed in the PMD layer and are coupled to source, drain, well tap, gate and field structure. Contact plugs 190 coupled to the body well tap 136 and the field structure 150 are as illustrated in FIG. 3*j*, while contact plugs coupled to the gate and S/D regions are not shown. The contact plugs coupled to the body well tap and field structure are commonly coupled to a conductive or metal line Mx in upper portion of the dielectric layer. The body well tap and the field structure, for example, are interconnected to a low potential or voltage source which is lower than the voltage values provided to the drain.

Additional processes may be performed to complete the device. Such processes may include forming additional interlevel dielectric (ILD) layers, contact plugs, interconnect metal levels, final passivation, dicing, packaging and testing.

Figure 4B:
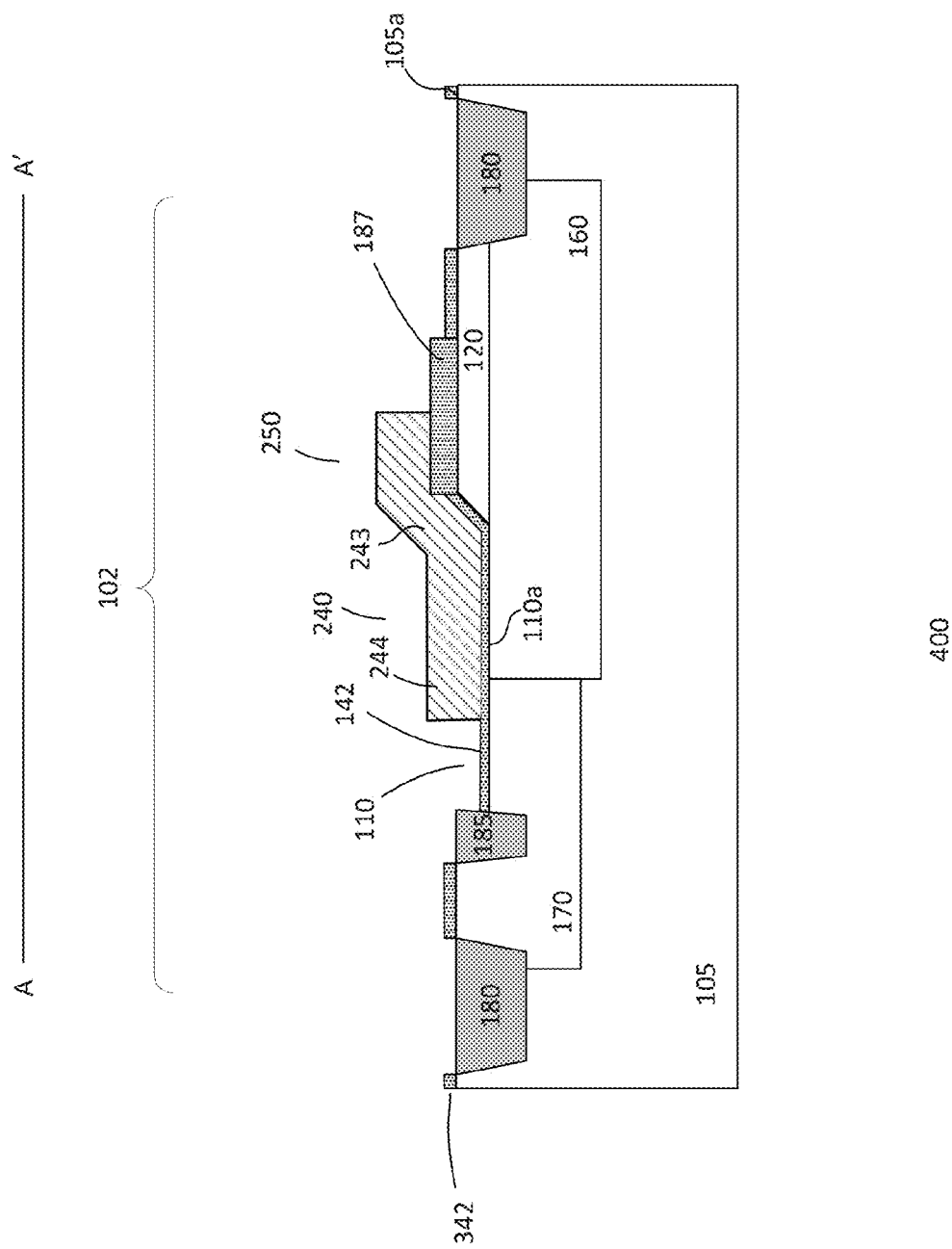
Figure 4C:
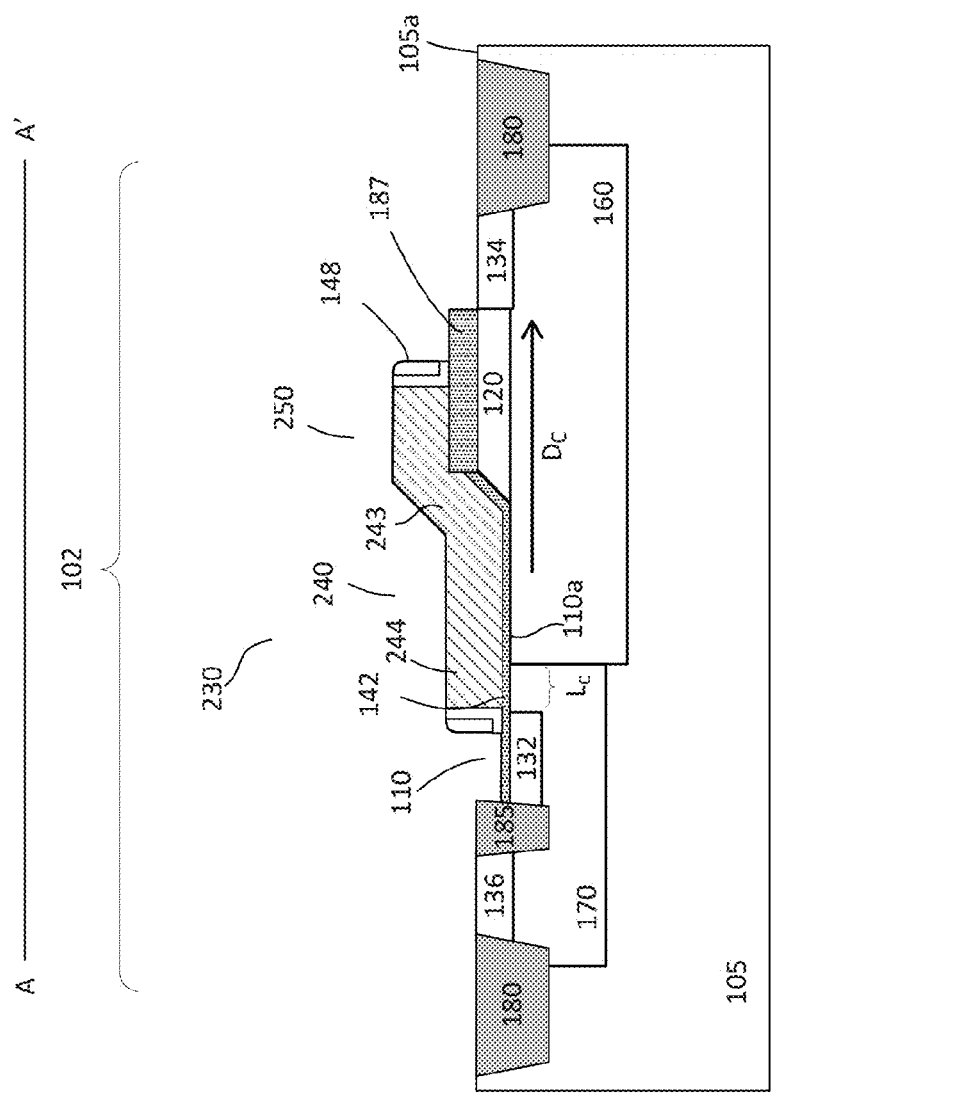

FIGS. 4*a*-4*c* show cross-sectional views of another embodiment of a process 400 for forming a device. The device formed by process 400 is the same as the device 200 shown in FIG. 2*a*-2*b* and the process 400 is similar to the process 300 as described in FIGS. 3*a*-3*j*. In the interest of brevity, common elements and features having same reference numerals and common processes may not be described or described in detail.

Referring to FIG. 4*a*, the process is at the same stage as that described in FIG. 3*g*. For example, the substrate is processed to include device and internal isolation regions as well as drift well, body well and RESURF region. The substrate, in one embodiment, is processed to include a recessed region 110 having a recessed surface 110*a* disposed lower than the top surface 105*a* of the substrate. A HV gate dielectric layer 142 is formed in the recessed region and a field oxide 187 is formed over a portion of the RESURF region 120.

A gate electrode layer 354 is conformally formed over the substrate as shown in FIG. 4*a*. In one embodiment, the gate electrode layer 354 is patterned to form a continuous gate structure. Patterning the gate electrode layer may be achieved by mask and etch techniques. For example, a patterned gate mask (not shown) may be provided on the substrate to protect a continuous portion of the gate electrode layer which partially overlaps the body well, drift well and the field oxide. Exposed portions of the gate electrode layer are removed to form the continuous gate structure as shown. The remaining gate electrode layer protected by the gate mask, for example, forms a continuous gate electrode 244 which extends from about the source region defined herein to overlap a portion of the field oxide 187 as shown in FIG. 4*b*. The gate electrode layer may also be patterned to form gates of other transistors in other device regions (not shown). Patterning the gate electrode layer, for example, may be achieved using an anisotropic etch, such as a RIE. Other techniques for patterning the gate electrode layer may also be useful. After patterning the gate, the gate mask is removed by, for example, ashing.

Referring to FIG. 4c, the process may continue as described in FIGS. 3i-3j to form the device 200 as shown and as described in FIGS. 2a-2b. For example, the process may continue to form sidewall spacers 148, source and drain regions 132 and 134, body well tap 136, dielectric layer (not shown), contact plugs (not shown) and metal lines. In one embodiment, the continuous gate structure 240 and the body well tap 136 are separately biased. For example, the gate structure and body well tap are coupled to separate metal lines for biasing.

The devices formed by processes described in FIGS. 3a-3j and FIGS. 4a-4c include similar or the same advantages as described earlier. Moreover, the process as described in FIGS. 3a-3j or FIGS. 4a-4c are highly compatible with CMOS processing.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a high voltage device comprising:
   providing a substrate prepared with isolation regions, wherein the isolation regions include a device isolation region and an internal isolation region, wherein the device isolation region defines a device region within the substrate and the internal isolation region is disposed within the device region, wherein a top substrate surface is coplanar with a top surface of the isolation regions;
   forming a first device well in the device region;
   forming a doped region within the first device well, wherein the doped region extends from the top substrate surface to a depth shallower than a bottom of the isolation regions;
   forming a recessed region after the doped region is formed in the first device well, wherein a depth of the recessed region is about equal to the depth of the doped region;
   forming a second device well in the device region and adjacent to the first device well; and
   forming a transistor, wherein forming the transistor comprises
      forming a gate on the substrate,
      forming a source region in the second device well and adjacent to a first side of the gate, and
      forming a drain region in the first device well, wherein the drain region is displaced away from the recessed region and a second side of the gate.

2. The method of claim 1 wherein a process for forming the recessed region comprises removing a portion of the top substrate surface and removing a portion of the doped region in the first device well, wherein a bottom of the recessed region defines a recessed substrate surface.

3. The method of claim 2 wherein:
   the source region extends from the recessed substrate surface to a depth below the doped region; and
   the drain region extends from the top substrate surface to a depth shallower than the depth of the source region.

4. The method of claim 1 wherein the first device well comprises first polarity type dopants, wherein the doped region in the first device well and the second device well comprise second polarity type dopants opposite to the first polarity type.

5. The method of claim 4 wherein the internal isolation region is disposed in the second device well and adjacent to the source region.

6. The method of claim 1 wherein forming the gate comprises:
   forming a gate dielectric which lines a bottom of the recessed region;
   forming a dielectric stack over the doped region and adjacent to the recessed region; and
   forming a gate electrode layer over the gate dielectric and the dielectric stack.

7. The method of claim 6 wherein forming the gate further comprises patterning the gate electrode layer to define a transistor gate electrode and a gate electrode of a field structure, wherein the gate electrode of the field structure is disposed on the dielectric stack.

8. The method of claim 1 wherein the recessed region is aligned to the internal isolation region.

9. The method of claim 1 comprising forming a heavily doped contact region in the second device well, wherein the internal isolation region is disposed between the heavily doped contact region and the source region.

10. The method of claim 6 wherein forming the gate further comprises patterning the gate electrode layer to form a continuous gate structure which overlaps a portion of the recessed region and a portion of the doped region.

11. The method of claim 6 wherein the drain region is formed after forming the dielectric stack, wherein the drain region is adjacent to the dielectric stack and the doped region in the first device well.

12. The method of claim 1 wherein the doped region in the first device well is disposed between the drain region and the recessed region.

13. A method for forming a high voltage device comprising:
   providing a substrate prepared with isolation regions, wherein the isolation regions include a device isolation region and an internal isolation region, wherein the device isolation region defines a device region within the substrate and the internal isolation region is disposed within the device region, wherein a top substrate surface is coplanar with a top surface of the isolation regions;
   forming a first device well in the device region;
   forming a doped region within the first device well, wherein the doped region extends from the top substrate surface to a depth shallower than a depth of the isolation regions;
   removing a portion of the top substrate surface and a portion of the doped region in the first device well to form a recessed region, wherein the recessed region includes a depth which is about equal to the depth of the doped region;
   forming a second device well in the device region and adjacent to the first device well; and forming a transistor, wherein forming the transistor comprises
    forming a gate on the substrate,
    forming a first source/drain (S/D) region in the second device well and adjacent to a first side of the gate, and
    forming a second S/D region in the first device well, wherein the second S/D region is displaced away from the recessed region and a second side of the gate.

14. The method of claim 13 wherein the first device well is displaced away from the internal isolation region.

15. The method of claim 14 wherein the recessed region is aligned to the internal isolation region.

16. The method of claim 13 wherein forming the gate comprises:
    forming a gate dielectric in the recessed region;
    forming a dielectric stack over the doped region and adjacent to the gate dielectric; and
    forming a gate electrode layer over the gate dielectric and the dielectric stack.

17. The method of claim 16 wherein forming the gate further comprises patterning the gate electrode layer to form a continuous gate structure which overlaps a portion of the recessed region and a portion of the doped region.

18. The method of claim 13 wherein the first device well comprises first polarity type dopants and the doped region in the first device well comprises second polarity type dopants opposite to the first polarity type.

19. A method for forming a high voltage device comprising:
    providing a substrate prepared with isolation regions, wherein the isolation regions include a device isolation region and an internal isolation region, wherein the device isolation region defines a high voltage (HV) device region within the substrate and the internal isolation region is disposed within the HV device region, wherein a top substrate surface is coplanar with a top surface of the isolation regions;
    forming a first device well in the HV device region, wherein the first device well is displaced away from the internal isolation region;
    forming a doped region within the first device well, wherein the doped region extends from the top substrate surface to a depth shallower than a depth of the isolation regions;
    forming a recessed region aligned to the internal isolation region, wherein a process for forming the recessed region comprises removing a portion of the top substrate surface and removing a portion of the doped region in the first device well, wherein a depth of the recessed region is about equal to the depth of the doped region;
    forming a second device well in the HV device region; and
    forming a transistor having a transistor gate disposed in the recessed region.

20. The method of claim 19 further comprising forming a field structure on the substrate and adjacent to the recessed region, wherein the field structure is disposed directly over the doped region.

* * * * *